(12) United States Patent
Tashiro

(10) Patent No.: US 10,186,432 B2
(45) Date of Patent: Jan. 22, 2019

(54) METHOD FOR MANUFACTURING SEMICONDUCTOR DEVICE

(71) Applicant: Renesas Electronics Corporation, Tokyo (JP)

(72) Inventor: Yukinori Tashiro, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/948,255

(22) Filed: Apr. 9, 2018

(65) Prior Publication Data

US 2018/0226275 A1    Aug. 9, 2018

Related U.S. Application Data

(63) Continuation of application No. 15/428,176, filed on Feb. 9, 2017, now Pat. No. 9,966,279.

(30) Foreign Application Priority Data

Mar. 30, 2016  (JP) ................................ 2016-068488

(51) Int. Cl.
*H01L 21/56*    (2006.01)
*H01L 21/78*    (2006.01)
(Continued)

(52) U.S. Cl.
CPC ........ *H01L 21/565* (2013.01); *B29C 45/0046* (2013.01); *B29C 45/14655* (2013.01); *H01L 21/4853* (2013.01); *H01L 21/78* (2013.01); *H01L 23/3114* (2013.01); *H01L 23/49548* (2013.01); *H01L 23/49838* (2013.01);
(Continued)

(58) Field of Classification Search
CPC . H01L 23/49548; H01L 24/97; H01L 21/565; H01L 21/4853; H01L 21/78; H01L 23/544; H01L 24/48; H01L 23/49838; H01L 23/49816; H01L 24/32;
(Continued)

(56) References Cited

U.S. PATENT DOCUMENTS 6,797,542 B2 * 9/2004 Kuratomi .............. H01L 21/565
                                              257/E21.504
6,835,596 B2   12/2004 Gotou
(Continued)

FOREIGN PATENT DOCUMENTS

JP  2002-231741 A   8/2002
JP  2002-261107 A   9/2002
(Continued)

*Primary Examiner* — Savitr Mulpuri
(74) *Attorney, Agent, or Firm* — Mattingly & Malur, PC

(57) ABSTRACT

The reliability of a semiconductor device is improved. During resin injection in a molding step, in a plan view, a plurality of gates of a molding die are arranged at positions different from those over extended lines of a plurality of dicing regions and a resin is injected from the gates. In this way, it becomes possible to reduce entrainment of air in the dicing regions and to lower an occurrence rate of voids. As a consequence, it becomes possible to suppress an occurrence of poor appearance such as formation of voids in a sealing body and to suppress formation of a starting point of a crack which may occur during a reflow process. Thus, the reliability of the semiconductor device can be improved.

6 Claims, 16 Drawing Sheets

(51) Int. Cl.

| | | |
|---|---|---|
| *H01L 23/00* | (2006.01) | |
| *H01L 21/48* | (2006.01) | |
| *H01L 23/31* | (2006.01) | |
| *H01L 23/544* | (2006.01) | |
| *H01L 23/498* | (2006.01) | |
| *B29C 45/14* | (2006.01) | |
| *B29C 45/00* | (2006.01) | |
| *H01L 23/495* | (2006.01) | |
| *B29C 45/27* | (2006.01) | |

(52) U.S. Cl.
CPC ............ *H01L 23/544* (2013.01); *H01L 24/48* (2013.01); *H01L 24/97* (2013.01); *B29C 45/2708* (2013.01); *H01L 23/3107* (2013.01); *H01L 23/49816* (2013.01); *H01L 24/32* (2013.01); *H01L 24/45* (2013.01); *H01L 24/49* (2013.01); *H01L 24/83* (2013.01); *H01L 24/85* (2013.01); *H01L 24/92* (2013.01); *H01L 2223/5446* (2013.01); *H01L 2224/32225* (2013.01); *H01L 2224/32245* (2013.01); *H01L 2224/45144* (2013.01); *H01L 2224/48091* (2013.01); *H01L 2224/48227* (2013.01); *H01L 2224/48228* (2013.01); *H01L 2224/48247* (2013.01); *H01L 2224/48465* (2013.01); *H01L 2224/49171* (2013.01); *H01L 2224/73265* (2013.01); *H01L 2224/92247* (2013.01); *H01L 2924/00014* (2013.01); *H01L 2924/15311* (2013.01); *H01L 2924/181* (2013.01)

(58) Field of Classification Search
CPC ................ H01L 23/3114; H01L 24/45; B29C 45/14655; B29C 45/0046
See application file for complete search history.

(56) References Cited

U.S. PATENT DOCUMENTS

| | | | |
|---|---|---|---|
| 7,384,582 B2 | 6/2008 | Tsuchida | |
| 7,803,660 B2* | 9/2010 | Murakami | ............ H01L 21/565 |
| | | | 438/107 |
| 8,129,273 B2* | 3/2012 | Yoshizawa | ............ H01L 21/566 |
| | | | 438/110 |
| 8,198,141 B2* | 6/2012 | Ito | ......... H01L 21/561 |
| | | | 438/110 |
| 8,349,661 B2 | 1/2013 | Okada | |
| 8,525,306 B2* | 9/2013 | Tashiro | ............... B29C 45/0046 |
| | | | 257/666 |
| 2009/0102071 A1 | 4/2009 | Kindo | |
| 2010/0148377 A1 | 6/2010 | Ito | |
| 2014/0001620 A1* | 1/2014 | Shimizu | .................. H01L 24/97 |
| | | | 257/676 |
| 2015/0031191 A1 | 1/2015 | Miyaki et al. | |
| 2017/0287737 A1 | 10/2017 | Tashiro | |

FOREIGN PATENT DOCUMENTS

| | | |
|---|---|---|
| JP | 2003-258158 A | 9/2003 |
| JP | 2014-204082 A | 10/2014 |
| JP | 2015-026719 A | 2/2015 |

\* cited by examiner

METHOD FOR MANUFACTURING SEMICONDUCTOR DEVICE

CROSS-REFERENCE TO RELATED APPLICATIONS

The disclosure of Japanese Patent Application No. 2016-068488 filed on Mar. 30, 2016 including the specification, drawings and abstract is incorporated herein by reference in its entirety.

BACKGROUND

The present invention relates to a method for manufacturing a semiconductor device and, specifically, it relates to a method for manufacturing a semiconductor device with use of a mold array process (hereafter, also called "MAP").

Japanese Unexamined Patent Application Publication No. 2002-231741 (Patent Document 1) discloses a method for manufacturing a semiconductor device in which resin molding is performed by injecting a sealing resin into both the cavities of an upper mold and a lower mold.

Japanese Unexamined Patent Application Publication No. 2002-261107 (Patent Document 2) discloses a method for manufacturing a semiconductor device in which resin molding is performed by allowing a molding region over a molding substrate to partially protrude.

Japanese Unexamined Patent Application Publication No. 2003-258158 (Patent Document 3) discloses a method for manufacturing a semiconductor device in which, over a multi-wiring substrate, numbers of warp-preventing holes are provided along the boundary line of unit wiring substrates thereof.

Japanese Unexamined Patent Application Publication No. 2014-204082 (Patent Document 4) discloses a method for manufacturing a semiconductor device in which sealing resin is so injected as to allow a flow of the sealing resin injected from, among a plurality of gates of a molding die, a gate positioned at the end portion to be dispersed.

Japanese Unexamined Patent Application Publication No. 2015-26719 (Patent Document 5) discloses a method for manufacturing a semiconductor device of the MAP type.

SUMMARY

The present inventors have found out the following problem. That is, in the MAP, in using a base material (for example, a wiring substrate, a lead frame, etc.) where a groove or a stepped portion is formed along its dicing region inside the dicing region (cutting region), when a resin passes through the dicing region of the base material at the time of collecting molding in a sealing step, air stagnating in the groove or the stepped portion is entrained. Eventually, voids are formed in a sealing resin layer.

As a result, it is feared that the reliability of the semiconductor device is deteriorated.

The above and further objects and novel features will more fully appear from the following detailed description in this specification and the accompanying drawings.

A method for manufacturing a semiconductor device according to one embodiment includes the steps of: preparing a base material having a plurality of first regions extending from a first side toward a second side over a main surface, a plurality of second regions provided between the respective first regions over the main surface, and a plurality of third regions provided between the first side and the second regions; and mounting semiconductor chips in the second regions of the base material. The method further includes the steps of: covering the first regions and the second regions with one cavity of a molding die and arranging the base material in the molding die such that a plurality of gates is arranged in the third regions; and injecting resin into the cavity from the gates and forming a sealing resin layer over the main surface of the base material. In a plan view, the first regions have grooves formed along the first regions, respectively. Further, over a straight line vertically crossing the first side and the second side in a plan view, one of the second regions and one of the third regions are arranged in a continuously joined manner and, during the resin injection, the resin is injected from the first side toward the second side.

Also, another method for manufacturing a semiconductor devices according to one embodiment includes the steps of: preparing a base material having a plurality of first regions extending from a first side toward a second side over a main surface, a plurality of second regions provided between the respective first regions over the main surface, and a plurality of third regions provided between the first side and the second regions; and mounting semiconductor chips in the second regions of the base material. The method further includes the steps of: covering the first regions and the second regions with one cavity of a molding die and arranging the base material in the molding die such that a plurality of gates is arranged in the third regions; and injecting resin into the cavity from the gates and forming a sealing resin layer over the main surface of the base material. The first regions have grooves formed along the first regions, respectively. Further, over a straight line vertically crossing the first side and the second side in a plan view, one of the second regions and one of the third regions are arrange in a continuously joined manner, and the resin is injected from the first side toward the second side. Still further, during the resin injecting, in a plan view, the resin is injected such that a vertex of the tip of which advances toward the second side of the resin, supplied into the cavity, fastest is located in the second region.

According to Embodiment 1, the reliability of a semiconductor device can be improved. Moreover, the yield rate of the semiconductor device can be enhanced.

DETAILED DESCRIPTION

Figure 1:
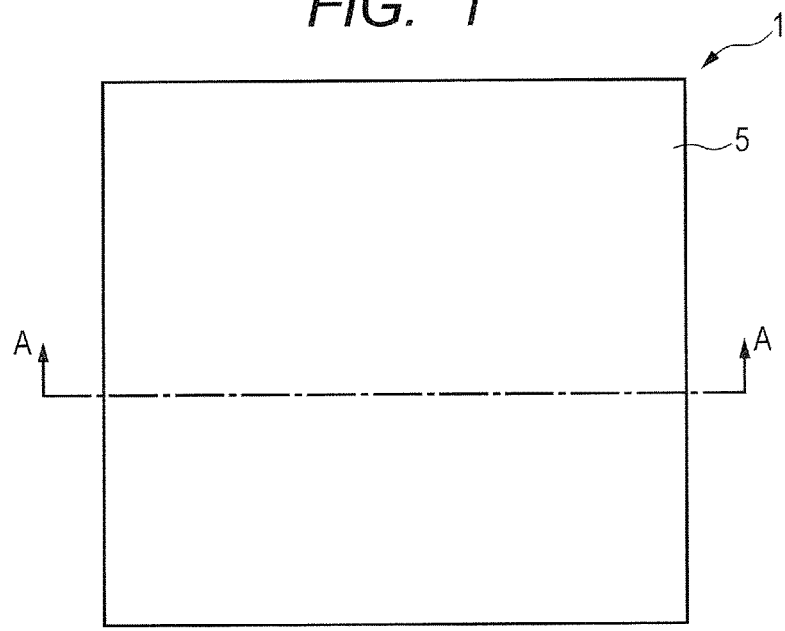
FIG. 1 is a plan view showing an example of the configuration of the semiconductor device according to Embodiment 1.

Basically, in description of the preferred embodiments given below, repeated descriptions of like elements are omitted except when necessary.

The present invention will be described using the following embodiment while being divided into a plurality of sections or embodiments if necessary for convenience sake. However, except for a case especially specified, the sections or embodiments are not irrelevant to each other, and one has a relationship with a part of a modified example or a complete modified example, or a detailed or supplementary explanation of the other.

Further, if the specification refers to the number of elements (including the number of pieces, values, amounts, ranges, and the like) in the following embodiment, the present invention is not limited to the specific number, but is smaller or larger than the specific number, except for a case especially specified or a case obviously limited to the specific number in principle.

Furthermore, it is obvious that the constitutional elements (including elemental steps and the like) are not necessarily essential in the following embodiments, except for a case especially specified or a case obviously deemed to be essential in principle.

Also, it is obvious that the expressions of "comprised of A", "composed of A", "have A", and "include A" do not exclude elements other than "A" except for a case especially specified that the element is limited to only "A". As similar to the above, if the specification refers to the shapes or positional relationships of constitutional elements in the following embodiments, the present invention includes those that are substantially close or similar to the constitutional elements in shapes and the like, except for a case especially specified or a case obviously deemed not to be close or similar in principle. The same applies to the values and ranges.

Hereinafter, the embodiment will be described in detail on the basis of the drawings. Further, constitutional elements having the same functions are given the same reference numerals in principle in the all drawings for explaining the following embodiments, and the repeated explanation thereof will be omitted. Further, hatched lines are used in some drawings used in the following embodiments in order to easily view the drawings even in the case of plan views.

Embodiment 1

<Semiconductor Device>

Figure 2:
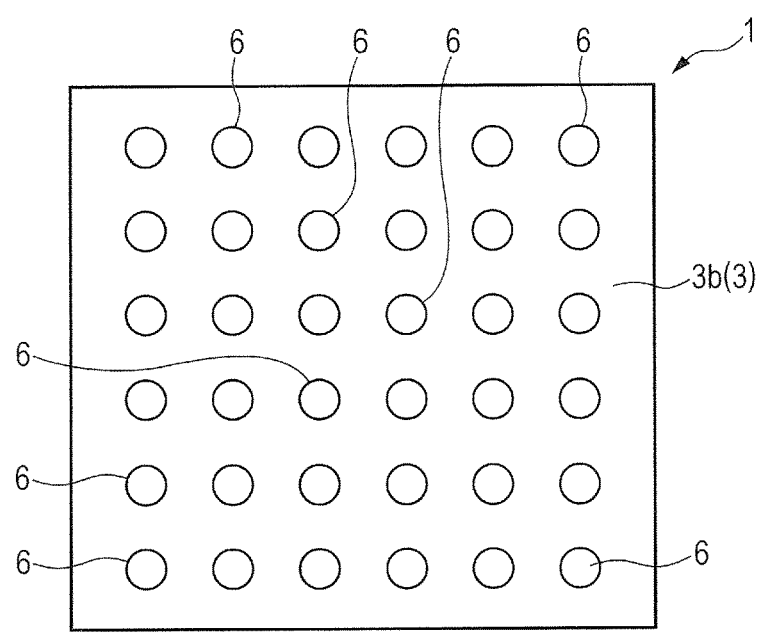
FIG. 2 is a back surface view showing an example of the configuration of the semiconductor device of FIG. 1.
Figure 3:
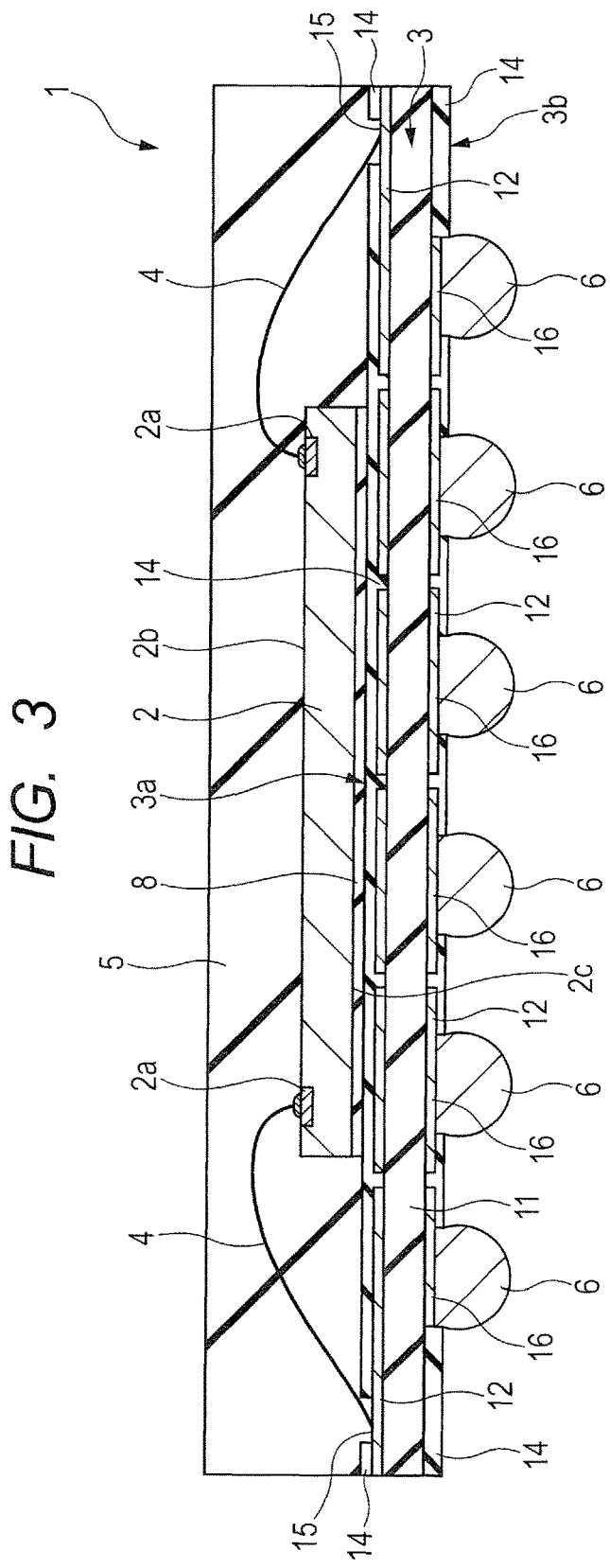
FIG. 3 is a sectional view showing an example of the configuration cut along line A-A FIG. 1.

FIG. 1 is a plan view showing an example of the configuration of a semiconductor device according to Embodiment 1, FIG. 2 is a back surface view showing an example of the configuration of the semiconductor device of FIG. 1, and FIG. 3 is a sectional view showing an example of the configuration cut along line A-A of FIG. 1.

The semiconductor device of Embodiment 1 shown in FIGS. 1 to 3 is a semiconductor device (semiconductor package) where a semiconductor chip 2 is mounted (bonded, coupled, packaged) over a wiring substrate 3 and where a semiconductor chip 2 is sealed by a sealing resin.

Further, in Embodiment 1, as an example of the above semiconductor device, the case where a plurality of external terminals provided on the lower surface side of the wiring substrate 3 are solder balls 6 will be explained. That is, in Embodiment 1, as an example of the above semiconductor device, a BGA (Ball Grid Array) 1 will be explained.

Also, in an assembling process, the BGA1 of Embodiment 1 is assembled such that a plurality of device regions are molded with resin collectively and, then, cut into pieces by dicing.

Now, the configuration of the BGA1 will be explained. The BGA1 includes: a semiconductor chip 2; a wiring substrate for supporting or mounting the semiconductor chip 2; and a plurality of bonding wires (hereafter, also simply called "wires") 4 for electrically coupling a plurality of electrodes (bonding pads, pad electrodes) exposed over a surface (main surface) 2b of the semiconductor chip 2 with a plurality of corresponding connection terminals (bonding leads) 15 of the wiring substrate 3.

Furthermore, the BGA1 includes: a sealing body 5 for covering an upper surface (chip supporting surface) 3a of the wiring substrate 3 including the semiconductor chip 2 and wires 4; and a plurality of solder balls 6 provided as external terminals over a lower surface (packaging surface) 3b of the wiring substrate 3 in an area array arrangement.

A planar shape of the semiconductor chip 2 intersecting its thickness is square (or rectangular). The semiconductor chip 2 is made such that various semiconductor elements or semiconductor integrated circuits are formed over a main surface of a semiconductor substrate (semiconductor wafer) containing a single crystal silicon etc., back grinding of the semiconductor substrate is performed as required, and the semiconductor substrate is divided into semiconductor chips 2 by dicing etc.

Further, the semiconductor chip 2 includes: a surface (semiconductor element formation side surface, a main surface, an upper surface) 2b and a back surface (surface opposite to the semiconductor element forming side surface, packaging surface, lower surface) 2c. The semiconductor chip 2 is mounted (arranged) over the upper surface (chip supporting surface) 3a of the upper surface of the wiring substrate 3 such that its surface 2b faces upward. Still further, the back surface 2c of the semiconductor chip 2 is bonded and fixed to the upper surface 3a of the wiring substrate 3 through an adhesive (die bonding material, bonding material) 8.

As the adhesive 8, for example, an insulating or conductive paste material or a film-like adhesive (die bonding film, die attach film), etc. can be used. The semiconductor chip 2 has a plurality of electrodes (bonding pad, pad electrode) 2a exposed over its surface 2b side. The electrodes 2a are electrically coupled to semiconductor elements or semiconductor integrated circuits formed inside or in a surface layer portion of the semiconductor chip 2.

Further, the wiring substrate 3 includes: an upper surface 3a being one main surface; a lower surface 3b being a surface opposite to the upper surface 3a; a plurality of connection terminals 15 so formed as to be exposed over the upper surface 3a; and a plurality of lands (bump land, land portion, electrode, pad, terminal) 16 so formed as to be exposed over the lower surface 3b.

The wiring substrate 3 includes: an insulating base material layer (insulating substrate, core material) 11; a conductive layer (conductive pattern, conductive film pattern, wiring layer) 12 formed on an upper surface side and a lower side of the base material layer 11; and a solder resist layer (insulating film, solder resist layer) 14 being an insulating layer (insulator layer, insulating film) so formed as to cover the conductive layer 12. For another embodiment, the wiring substrate 3 is formed as a multilayer wiring substrate (for example, a wiring substrate having a four-layer wiring layer) which is made by laminating a plurality of insulating layers and a plurality of wiring layers.

The conductor layer 12 is in a form of a pattern, which is a conductive pattern serving as a terminal, a wiring, or a wiring layer of the wiring substrate 3. Moreover, the conductive layer 12 includes a conductive material and can be formed with use of a copper thin film formed, for example, by a plating method.

Moreover, on the upper side of the wiring substrate 3, a plurality of connection terminals (electrode, bonding lead, pad electrode) 15 for electrically coupling the wires 4 are formed. On the other hand, on the lower surface side of the wiring substrate 3, a plurality of conductive lands 16 for coupling the solder balls 6 are formed. Then, the connection terminals 15 on the upper surface side of the base material layer 11 are electrically coupled with the lands 16 on the lower surface side of the base material layer 11.

As a consequence, a plurality of electrodes 2a of the semiconductor chip 2 are electrically coupled to the connection terminals 15 of the wiring substrate 3 through the wires 4 and, further, are electrically coupled to the lands 16 of the wiring substrate 3 through the conductive layer 12 of the wiring substrate 3.

Also, the wire 4 is a metal thin wire such as a gold wire.

Moreover, the solder resist layer 14 serves as an insulating layer (insulating film) for protecting the conductive layer 12 and covers the conductive layer 12 on the upper surface side and lower side of the base material layer 11. Still further, the semiconductor chip 2 is mounted over the solder resist layer 14 on the upper surface 3a side of the wiring substrate 3 through an adhesive material 8.

Moreover, the lands 16 are so formed as to be exposed over the lower surface 3b of the wiring substrate 3 and are arranged in an array pattern. The solder ball (ball electrode, protruding electrode, electrode, external terminal, external connection terminal) 6 is coupled to (formed in) each of the lands 16. For this reason, over the lower surface 3b of the wiring substrate 3, the solder balls 6 are arranged in the array pattern.

Moreover, the solder ball 6 can serve as an external terminal (external connection terminal) of the BGA1. Accordingly, the BGA1 of the present embodiment has a plurality of external connection terminals (solder balls 6) formed respectively over the lands 16 of the lower surface 3b of the wiring substrate 3. Therefore, the electrodes 2a of the semiconductor chip 2 are electrically coupled, through the wires 4, to the connection terminals 15 of the wiring substrate 3. Further, the electrodes 2a are electrically coupled, through the conductive layer 12 of the wiring substrate 3, to the lands 16 of the wiring substrate 3 and the solder balls 6 coupled to the lands 16.

The above arrangement is also applicable to a case of the semiconductor device having an LGA (Land Grid Array) configuration where there is used, as an external connection terminal, a conductive land to which solder balls are not coupled as external connection terminals.

Moreover, the sealing body (sealing resin layer, sealing resin, sealing resin part, sealing part) 5 includes, for example, a resin material such as a thermosetting-resin material and may contain a filler etc. For example, the sealing body 5 is formed with use of an epoxy resin containing the filler. The sealing body 5 covers the semiconductor chip 2 and the wires 4 over the upper surface 3a of the wiring substrate 3. That is, the sealing body 5 is formed over the upper surface 3a of the wiring substrate 3, seals the semiconductor chip 2 and the wires 4, and protects them.

<Wiring Substrate>

Figure 4:
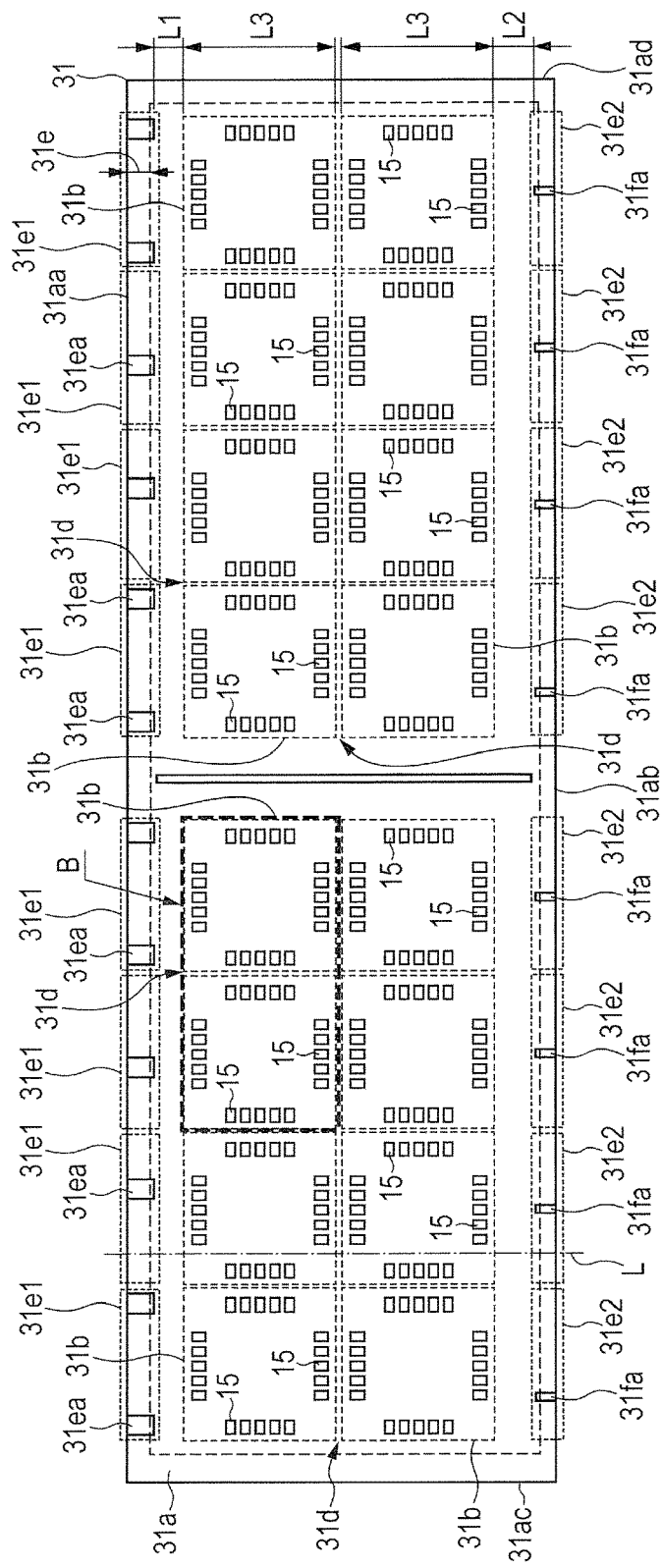
FIG. 4 is a plan showing an example of the configuration of a chip mounting side of a wiring substrate as used in assembling the semiconductor device of FIG. 1.
Figure 5:
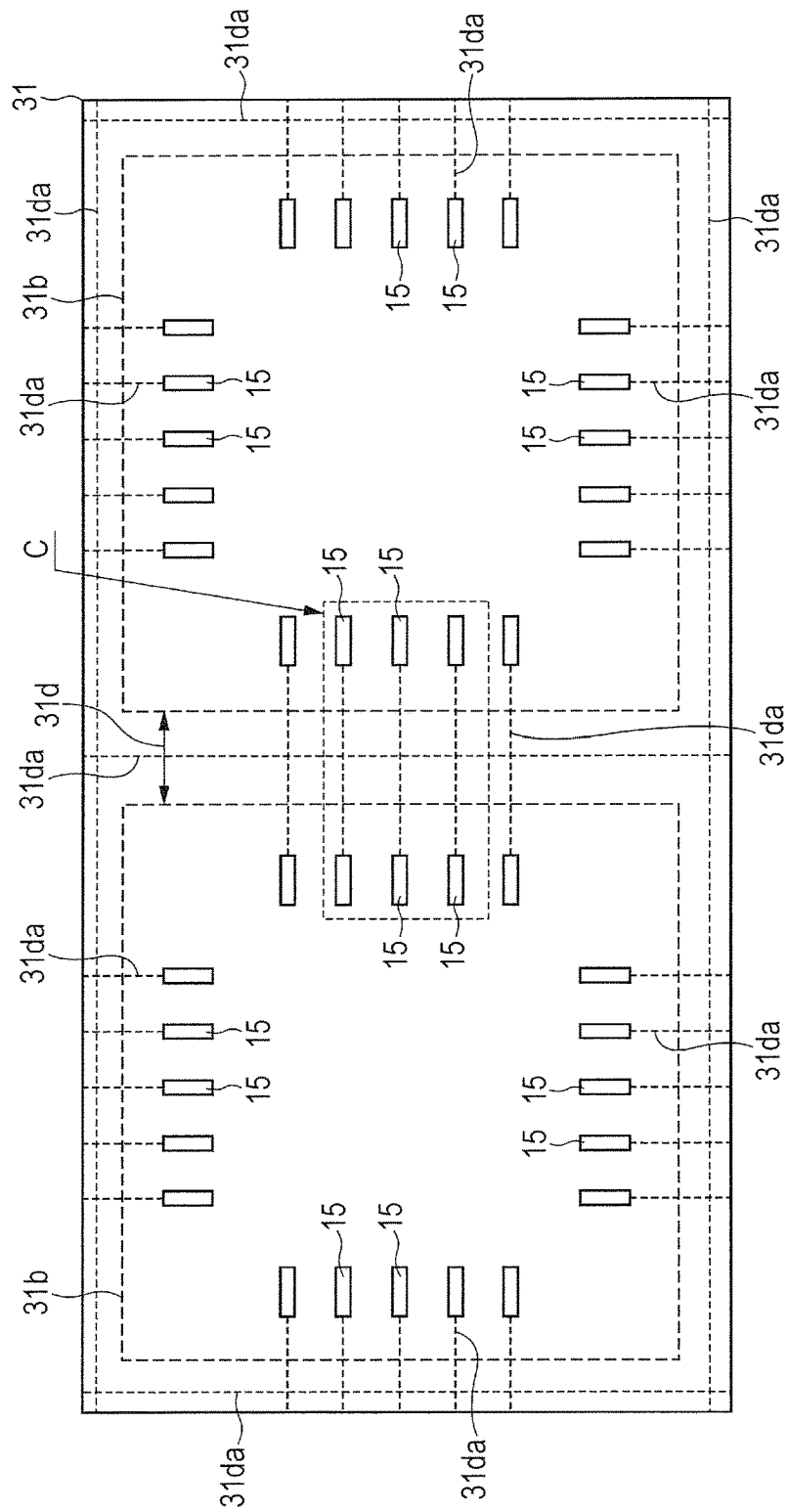
FIG. 5 is a fragmentary enlarged plan view showing a B portion of FIG. 4 in enlarged form.
Figure 6:
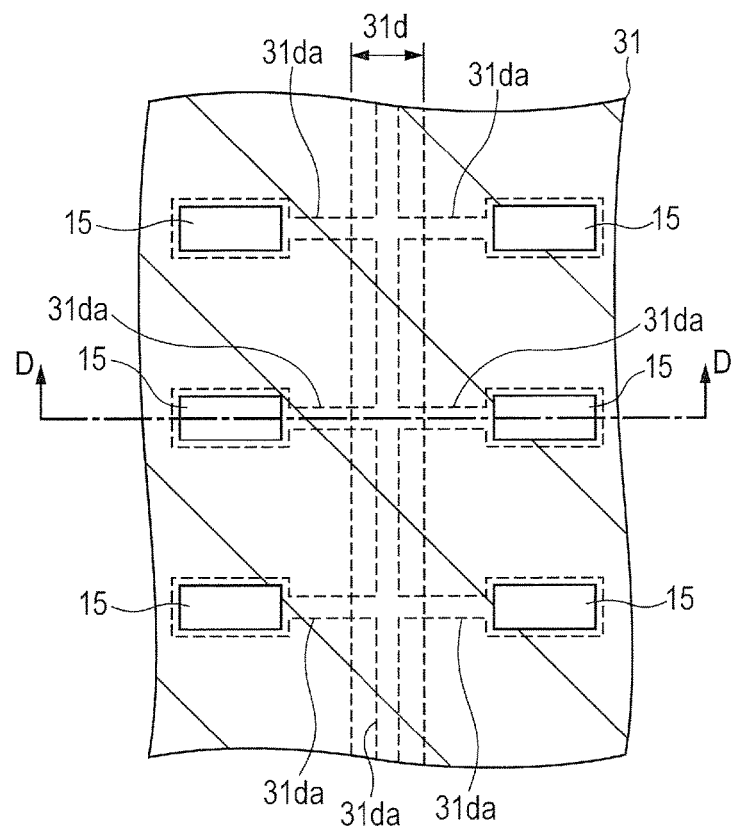
FIG. 6 is a fragmentary enlarged plan view showing a C portion of FIG. 5 in enlarged form.
Figure 7:
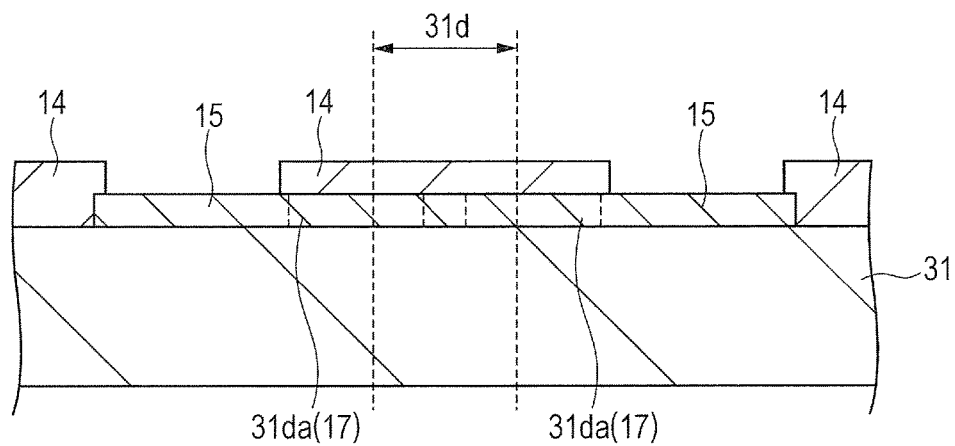
FIG. 7 is an enlarged sectional view showing an example of the configuration cut along line D-D of FIG. 6.
Figure 8:
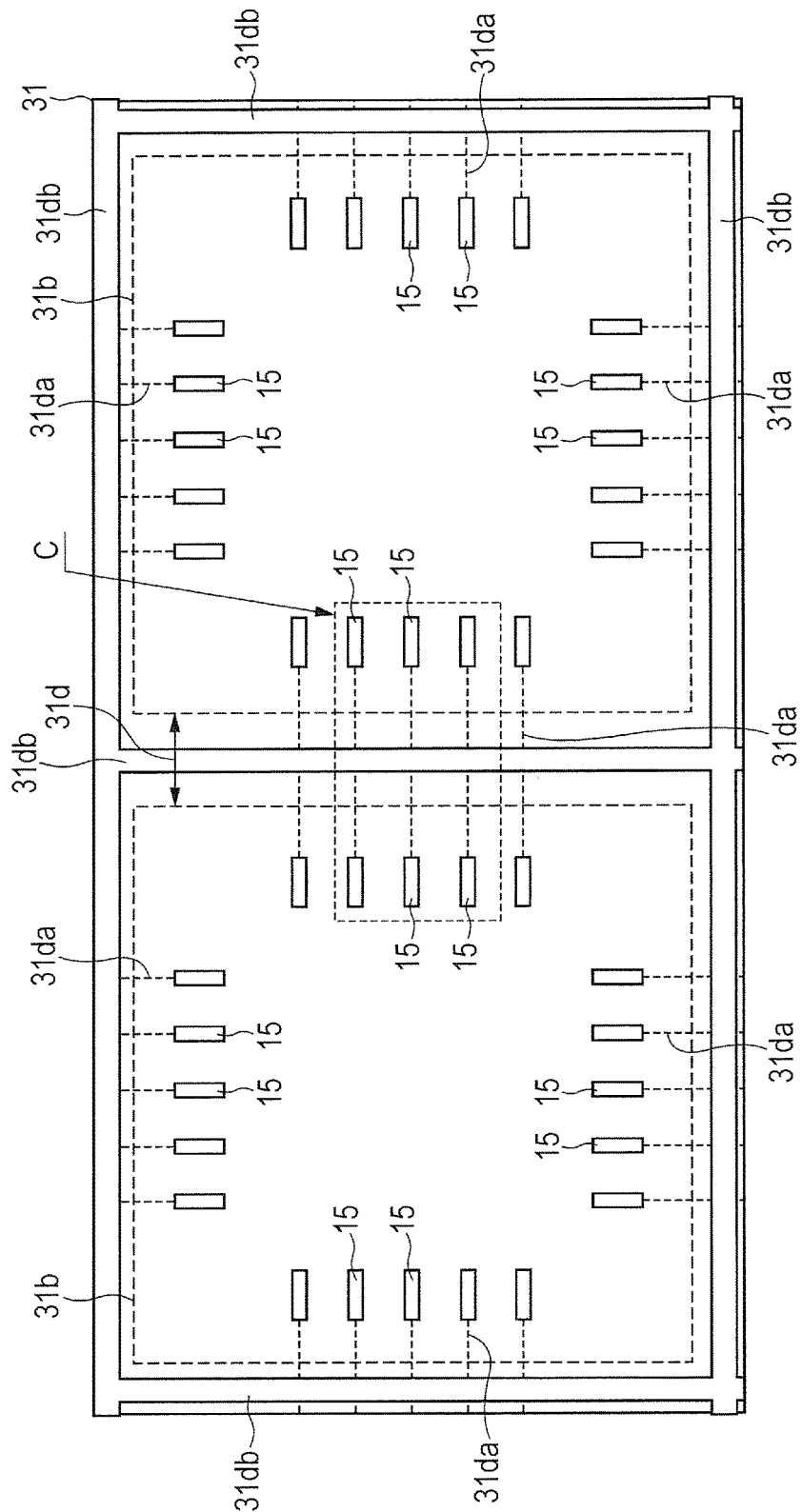
FIG. 8 is a fragmentary enlarged plan view showing an example of the configuration after etch-back of the substrate of FIG. 5.
Figure 9:
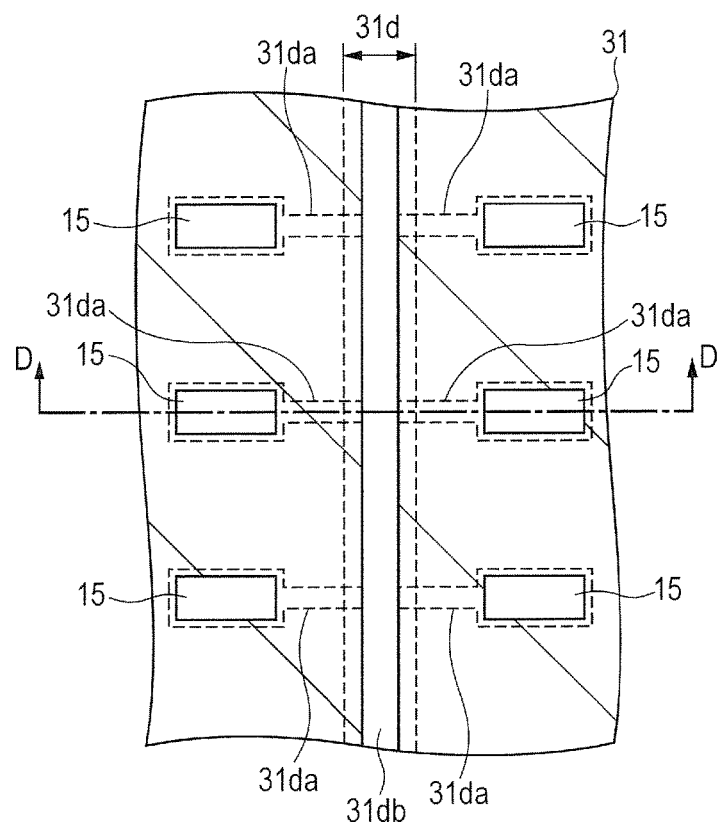
FIG. 9 is a fragmentary enlarged plan view showing a C portion of FIG. 8 in enlarged form.
Figure 10:
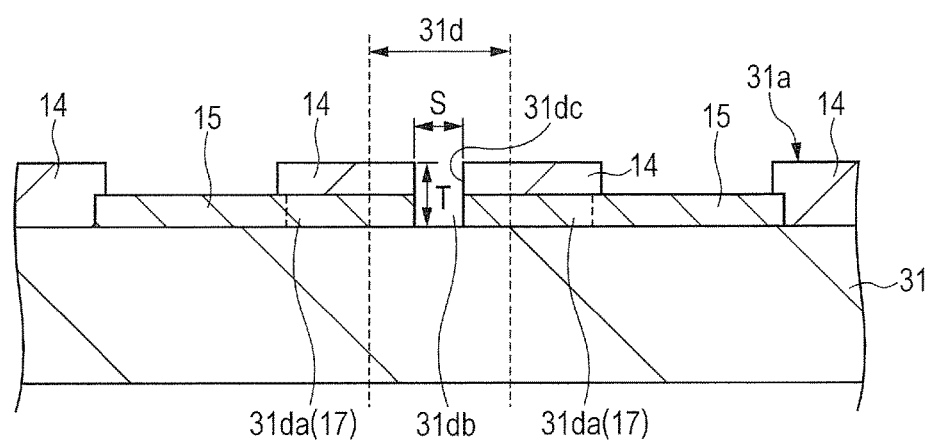
FIG. 10 is an enlarged sectional view showing an example of the configuration cut along line D-D of FIG. 9.

FIG. 4 is a plan view showing an example of the configuration of a chip mounting surface side of the wiring substrate as used in assembling the semiconductor device of FIG. 1, FIG. 5 is a fragmentary enlarged plan view showing a B portion of FIG. 4 in enlarged form, FIG. 6 is a fragmentary enlarged plan view showing a C portion of FIG. 5 in enlarged form, and FIG. 7 is an enlarged sectional view showing an example of the configuration cut along line D-D of FIG. 6. Further, FIG. 8 is a fragmentary enlarged plan view showing an example of the configuration after etch back of the substrate of FIG. 5, FIG. 9 is a fragmentary enlarged plan view showing a C portion of FIG. 8 in enlarged form, and FIG. 10 is an enlarged sectional view showing an example of the configuration cut along line D-D of FIG. 9.

Next, a wiring substrate (matrix substrate) used in assembling the BGA1 will be explained. The wiring substrate 31 used in assembling the BGA1 is a matrix substrate where the wiring substrates 3 (semiconductor device regions 31b shown in FIG. 4) are formed being joined in a matrix pattern.

The wiring substrate 31 is a base substrate of the wiring substrate 3 shown in FIG. 3 and, for example, is a four-layer wiring substrate provided with a four-layer wiring layer. Also, the wiring substrate 3 of the above semiconductor device corresponds to the one obtained by cutting the wiring substrate 31 in a cutting step (cut-into-pieces step) to be described later, and divided into individual semiconductor device regions (second region, device region, substrate region, unit substrate region) 31b. That is, the wiring substrate 31 has a configuration where there are arranged a plurality of semiconductor device regions 31b from each of which one semiconductor device (BGA1) is formed in a matrix pattern.

Further, according to Embodiment 1, when explaining the details of the wiring substrate 31, as a typical example, among the semiconductor device regions 31b arranged in the shape of a matrix, two semiconductor device regions 31b adjacent to each other will be explained.

The wiring substrate 31 includes: an upper surface (first surface, main surface, surface, chip mounting surface) 31a; and a lower surface (second surface, back surface, packaging surface, ball mounting surface) 32a, opposite to the upper surface 31a, to be shown in FIG. 19 later. Furthermore, as shown in FIG. 4, the upper surface 31a includes: a first side 31aa corresponding to the gate side; a second side 31ab opposed to (on the opposite side of) the first side 31aa; a third side 31ac being a short side; and a fourth side 31ad opposed to (on the opposite side of) the third side 31ac. Still further, the upper surfaces 31a includes: a plurality of dicing regions (first regions) 31d extending from the first side 31aa toward the second side 31ab; a plurality of semiconductor device regions (second regions, device regions) 31b provided between every two adjacent dicing regions 31d among a plurality of dicing regions 31d; and a plurality of gate pattern arrangement regions (third regions) 31e1 provided between the first side 31aa and the semiconductor device regions 31b. In addition, the dicing regions 31d are also provided along a direction extending from the third side 31ac toward the fourth side 31ad. That is, there are the dicing regions 31d extending from the first side 31aa toward the second side 31ad and the dicing regions 31d extending from the third side 31ac toward the fourth side 31ad, both of which cross at right angles at a plurality of points. Also, the semiconductor device region 31b is a quadrangular region surrounded by the four dicing regions 31d.

In other words, the dicing regions (first region, scribe region, cutting region) 31d are provided between two adjacent semiconductor device regions 31b. However, in the case of the semiconductor device region 31b arranged in the outermost circumferential part, the dicing regions 31d are formed in the circumferential part of the semiconductor device region 31b. Thus, over the upper surface 31a, the dicing regions 31d are arranged in a lattice pattern in a plan view. Furthermore, as shown in FIG. 4, the wiring substrate 31 so includes, in a peripheral part, over of the upper surface 31a, an edge region 31e as to surround the semiconductor device regions 31b and the dicing regions 31d. In addition, the edge region 31e has the gate pattern arrangement regions (third regions) 31e1 in which a plurality of gate patterns 31ea are arranged, respectively, and a plurality of air vent pattern arrangement regions 31e2 where a plurality of air vent patterns 31fa are arranged, respectively. Moreover, the gates of the molding die used in a next molding step are also arranged, respectively in a plurality of gate pattern arrangement regions (the third region) 31e1.

Moreover, as shown in FIG. 4, in a plan view, over the straight line L which crosses at right angles with a first side 31aa and a second side 31ab, one of the semiconductor device regions 31b and one of the gate pattern arrangement regions 31e1 are arranged in a row.

Moreover, a plurality of connection terminals (bonding lead, electrode) 15 are provided in the semiconductor device region 31b along each of four sides of the semiconductor device region 31b. Further, as shown in FIG. 7, a solder resist layer 14 is formed in an upper surface 31a side such that two or more connection terminals 15 is exposed.

On the other hand, the solder resist layer (see FIG. 3) 14 is formed such that a plurality of lands 16 is exposed also on the lower surface 32a (see FIG. 19) side. That is, the lands (bump lands, electrodes) 16 which are formed in a matrix pattern (lattice pattern) and the solder resist layer (insulating film) 14 for exposing the two or more lands 16 are provided in the lower surface 32a.

Figure 19:
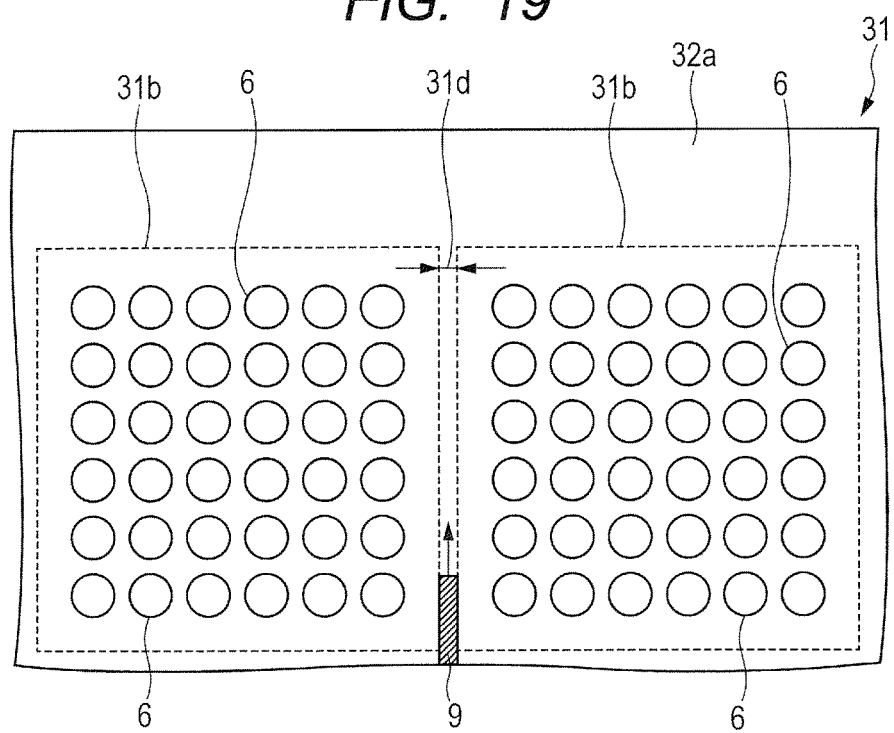
FIG. 19 is a fragmentary enlarged plan view showing an example of the configuration during dicing in assembling the semiconductor device of FIG. 1.

In this regard, in a cutting step to be described later, a dicing regions 31d is a region to be cut (removed) with a dicing blade 9 (see FIG. 19 shown later) to be used. Therefore, a width of the dicing region 31d is equivalent to a width of the dicing blade 9.

However, it is cut at a position which is shifted a little from the expected dicing regions 31d, which is caused by displacement of the insulating film (solder resist layer 14) occurring in a manufacturing step of the wiring substrate 31 and a slack of the dicing blade 9 to be used, etc.

Further, in the edge region 31e on the gate arrangement side of the upper surface 31a of the wiring substrate 31, as described above, two or more metal gate patterns 31ea are formed. On the other hand, two or more metal air vent patterns 31fa are formed in the edge region 31e of a second side 31ab (air vent arrangement side) of the upper surface 31a. These gate patterns 31ea and the two or more air vent patterns 31fa make it easy to exfoliate a resin formed in the edge region 31e after the resin molding.

In addition, as shown in FIGS. 5 and 6, in each dicing region 31d of the wiring substrate 31, a feeder 31da for electrolytic plating is formed. That is, the feeders 31da for applying electrolytic plating to the respective connection terminals 15 are provided in the dicing region 31d. Then, the feeders 31da pulled out from the connection terminals 15 arranged on both sides across the dicing region 31d are coupled with the feeders 31da in the dicing region 31d. Moreover, in a dicing region located in the periphery of the semiconductor device region 31b, the feeder 31da pulled out from the connection terminal 15 arranged inside the dicing region 31d is coupled with the feeder 31da in the dicing region 31d arranged in the peripheral part. That is, each connection terminal 15 is coupled with any one of the feeders 31da in the dicing regions 31d. In addition, as shown in FIG. 7, part of each of the connection terminals 15 is exposed from the solder resist layer 14 which is an insulating film. However, each feeder 31da is covered with the solder resist layer 14.

In addition, as shown in FIGS. 8 to 10, as for the wiring substrate 31 used in Embodiment 1, in its dicing region 31d, the feeder 31da for electrolytic plating has been removed by the etching etc. That is, in the wiring substrate 31 used when starting the assembly of the BGA1, the feeder 31da for electrolytic plating provided in the dicing region 31d has been removed by etching etc. (also called "etch back") in advance. More specifically, in the dicing regions 31d of the wiring substrate 31 used for the assembly of the BGA1, as shown in FIG. 10, there is exposed a surface of the wiring substrate (base material) 31 located in a lower layer (inner layer) of a solder resist layer (insulating film, protection film) 14 formed on the upper surface 31a side of the wiring substrate 31.

More specifically, a groove 31db is formed in each of the dicing regions 31d by etching etc. Each groove 31db is a concave stepped portion having a wall part 31dc including a wiring part (feeder 31da) 17 coupled with the connection terminal 15 and a solder resist layer (insulating film) 14 covering the wiring part 17.

<Method for Manufacturing Semiconductor Device>

Figure 11:
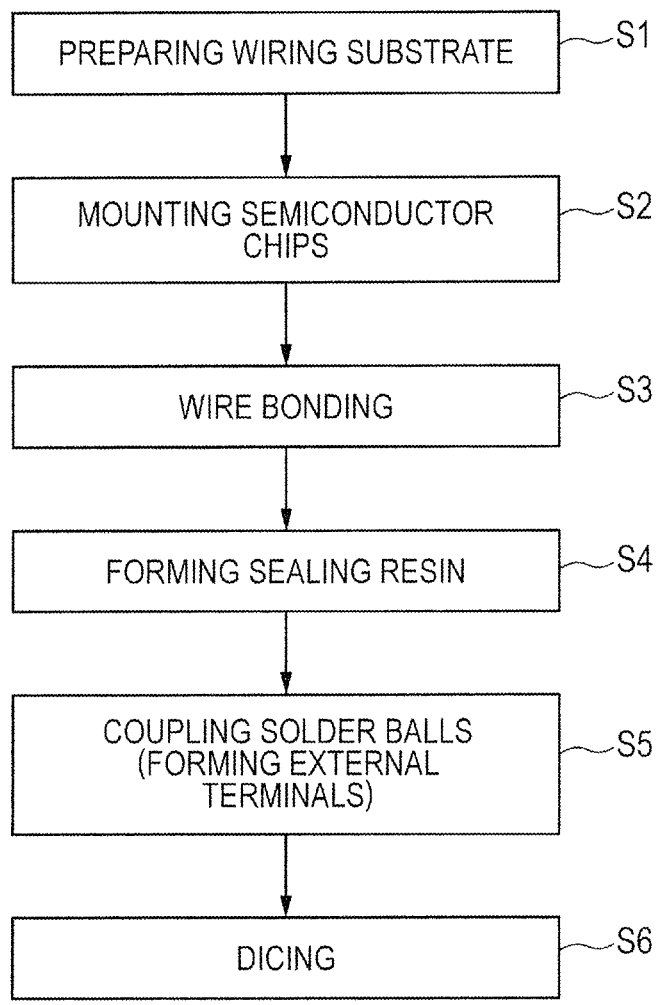
FIG. 11 is a flowchart showing an example of the sequence of assembling the semiconductor device of FIG. 1.

FIG. 11 is a flowchart showing an example of the sequence of assembling the semiconductor device of FIG. 1.

The method for manufacturing the semiconductor device of Embodiment 1 will be explained according to the flowchart of FIG. 11.

1. Wiring Substrate Preparation Step

In Embodiment 1, an assembly adopting the MAP method will be explained. According to the MAP method, with use of a many-picking wiring substrate (matrix substrate) 31 where the wiring substrates 3 (semiconductor device regions 31b shown in FIG. 4) are formed being coupled with one another in a matrix pattern, the semiconductor device regions 31b are resin-molded collectively and, then, cut into individual semiconductor devices (BGA1). First, in the wiring substrate preparation (step S1) shown in FIG. 11, the wiring substrate 31 shown in FIG. 4 is prepared. The wiring substrate 31 is a mother substrate for the wiring substrate 3 shown in FIG. 3. The wiring substrate 3 of the semiconductor device corresponds to what is obtained by cutting the wiring substrate 31 in a cutting step (cut-into-pieces step) to be described later and divided into semiconductor device regions (second region, a device region, a substrate region, unit substrate region) 31b. That is, the wiring substrate 31 has the configuration where the semiconductor device region 31b from each of which is a single semiconductor device (BGA1) is formed are arranged in a matrix pattern.

Further, in the assembly of the semiconductor device of Embodiment 1, when explaining the details, as a typical example, among the semiconductor device regions 31b arranged in the matrix pattern, two adjacent semiconductor device regions 31b will be explained.

The wiring substrate 31 has an upper surface 31a and a lower surface 32a opposite to the upper surface 31a. Over the upper surface 31a, the semiconductor device regions 31b and the dicing regions 31d are formed. More specifically, in a plan view, the dicing regions 31d are arranged in a lattice pattern. Further, a quadrangular region surrounded by four dicing regions 31d serves as the semiconductor device region 31b. Moreover, a plurality of connection terminals 15 is provided in each of the semiconductor device regions 31b.

The feeder 31da for plating shown in FIG. 7 has been removed in advance by etching etc. Therefore, inside the each dicing region 31d, as shown in FIG. 10, grooves 31db are formed along the dicing regions 31d.

On the other hand, as shown in FIG. 19 later, on the side of the lower surface 32a also, as in the upper surface 31a side, the semiconductor device regions 31b and the dicing regions 31d are provided. The lands 16 for coupling external terminals (see FIG. 3) are arranged in the lattice pattern in each of the semiconductor device regions 31b. As in the case of the upper surface 31a side, the above feeders 31da for plating have been removed in advance by etching etc. Therefore, the groove 31db is formed in each internal portion of the dicing region 31d along the dicing region 31d.

2. Semiconductor Chip Mounting Step

Figure 12:
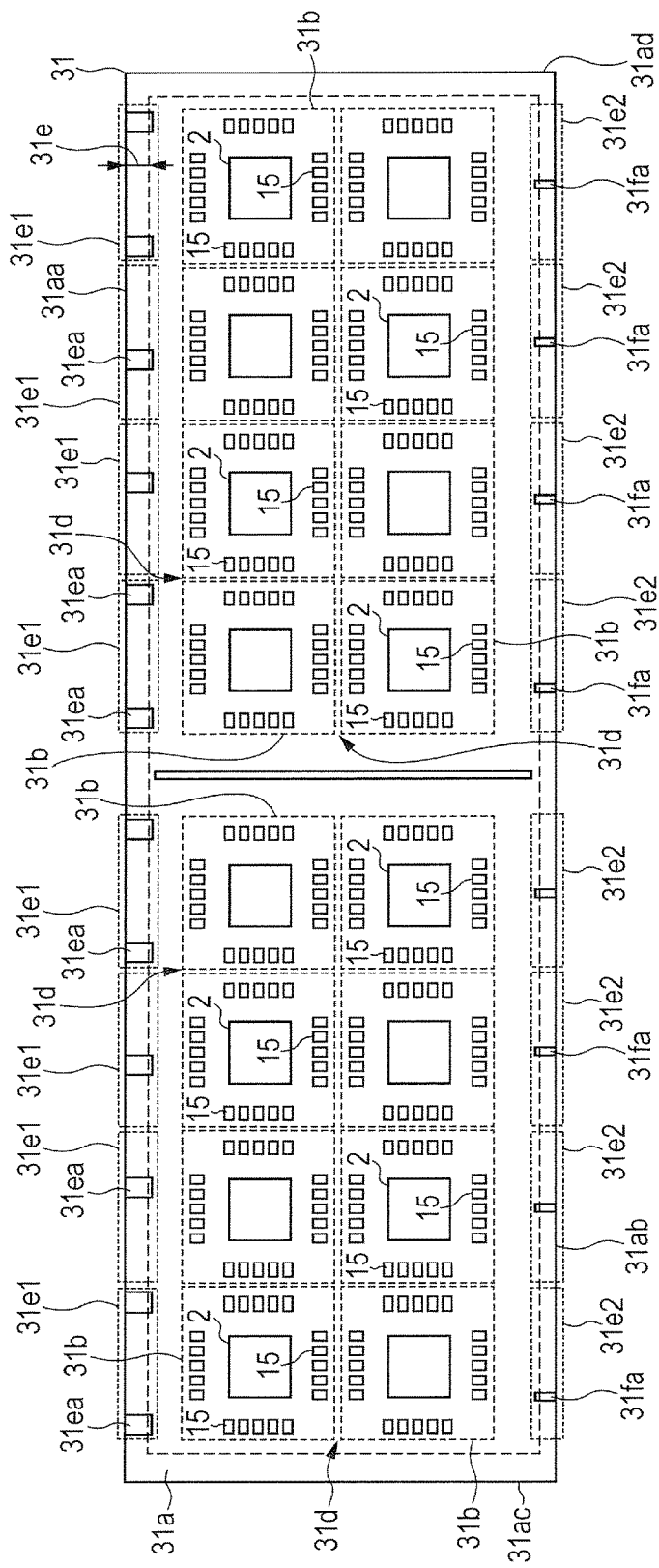
FIG. 12 is a plan view showing an example of the configuration after die bonding in the process of assembling the semiconductor device of FIG. 1.

FIG. 12 is a plan view showing an example of the configuration after die bonding in the process of assembling the semiconductor device of FIG. 1.

After preparation of the wiring substrate 31, the semiconductor chip 2 is mounted (die bonded) in a semiconductor chip mounting process (step S2) shown in FIG. 11. That is, as shown in FIG. 12, the semiconductor chip 2 is mounted in each of the semiconductor device regions 31b of the upper surface 31a of the wiring substrate 31 through an adhesive 8 shown in FIG. 3. In addition, as the adhesive 8, a paste-like adhesive, a film-like adhesive, etc. can be used.

3. Wire Bonding Step

Figure 13:
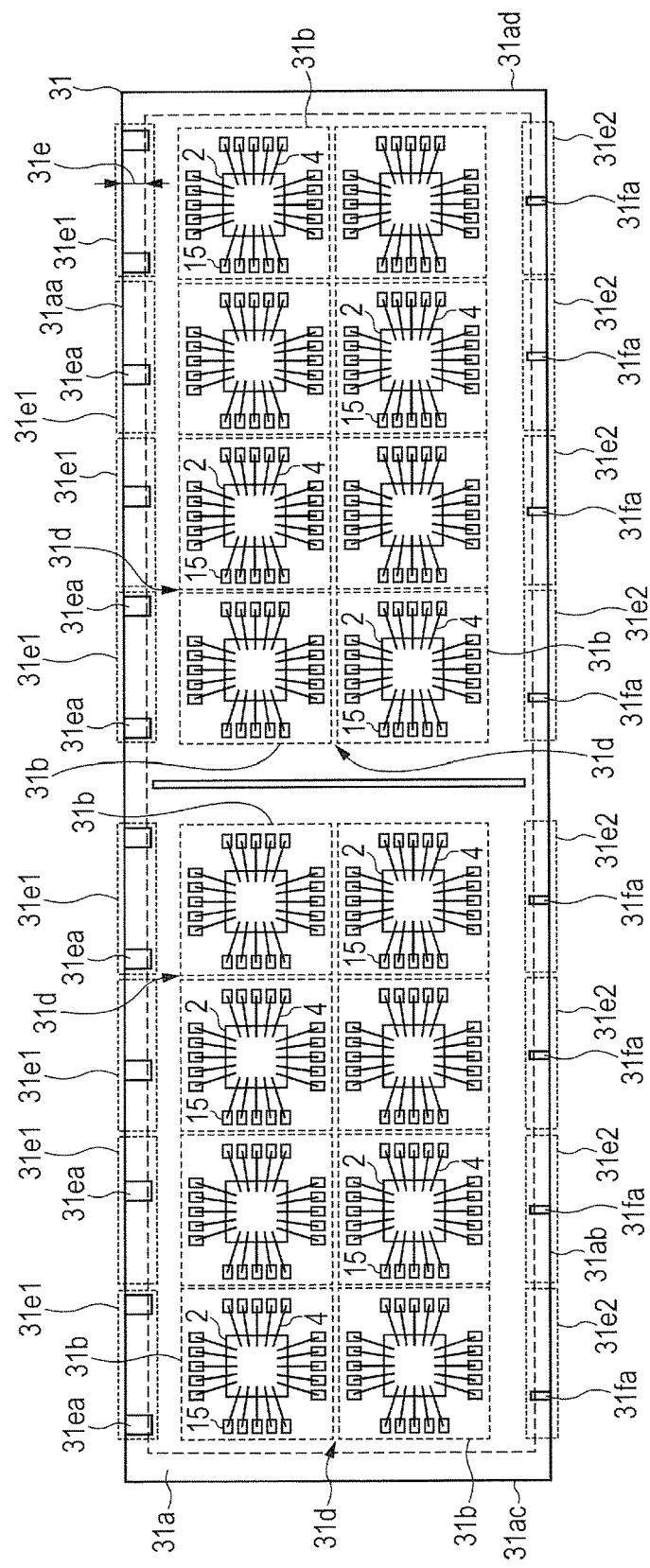
FIG. 13 is a plan view showing an example of the configuration after wire bonding in the process of assembling the semiconductor device of FIG. 1.

FIG. 13 is a plan view showing an example of the configuration after wire bonding in the process of assembling the semiconductor device of FIG. 1.

After mounting the semiconductor chip, the wire bonding (step S3) shown in FIG. 11 is performed, and each electrode 2a of the semiconductor chip 2 is electrically couples with a corresponding connection terminal 15 formed over the wiring substrate 31 through a wire 4. That is, as shown in FIG. 13, the connection terminals 15 of the semiconductor device region 31b of the upper surface 31a of the wiring substrate 31 and the electrodes 2a (see to FIG. 3) of the semiconductor chip 2 bonded over the semiconductor device region 31b are electrically coupled through the wires 4.

4. Molding Step

Figure 14:
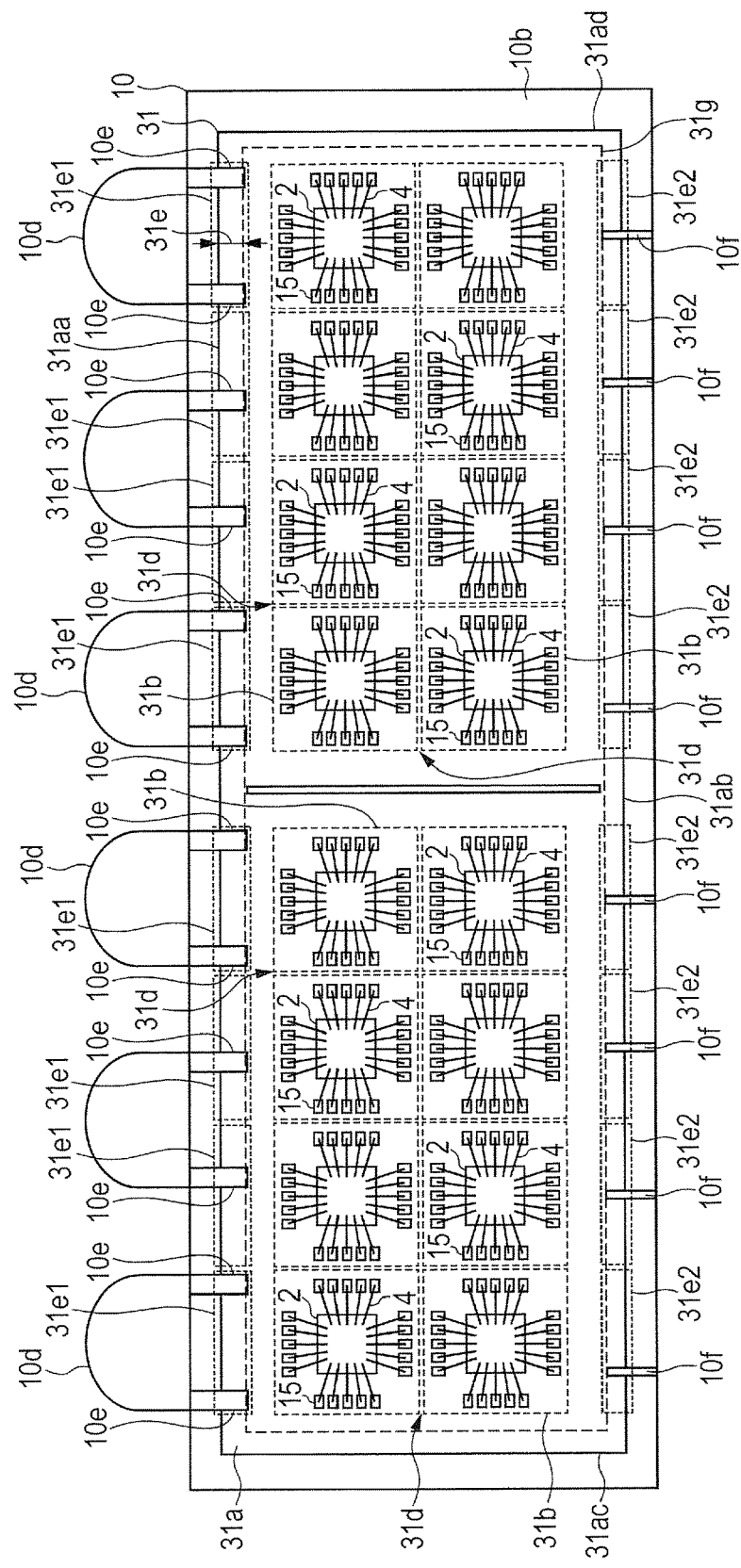
FIG. 14 is a plan view showing an example of a state of the substrate being arranged in a molding die during a molding step in assembling the semiconductor device of FIG. 1.
Figure 15:
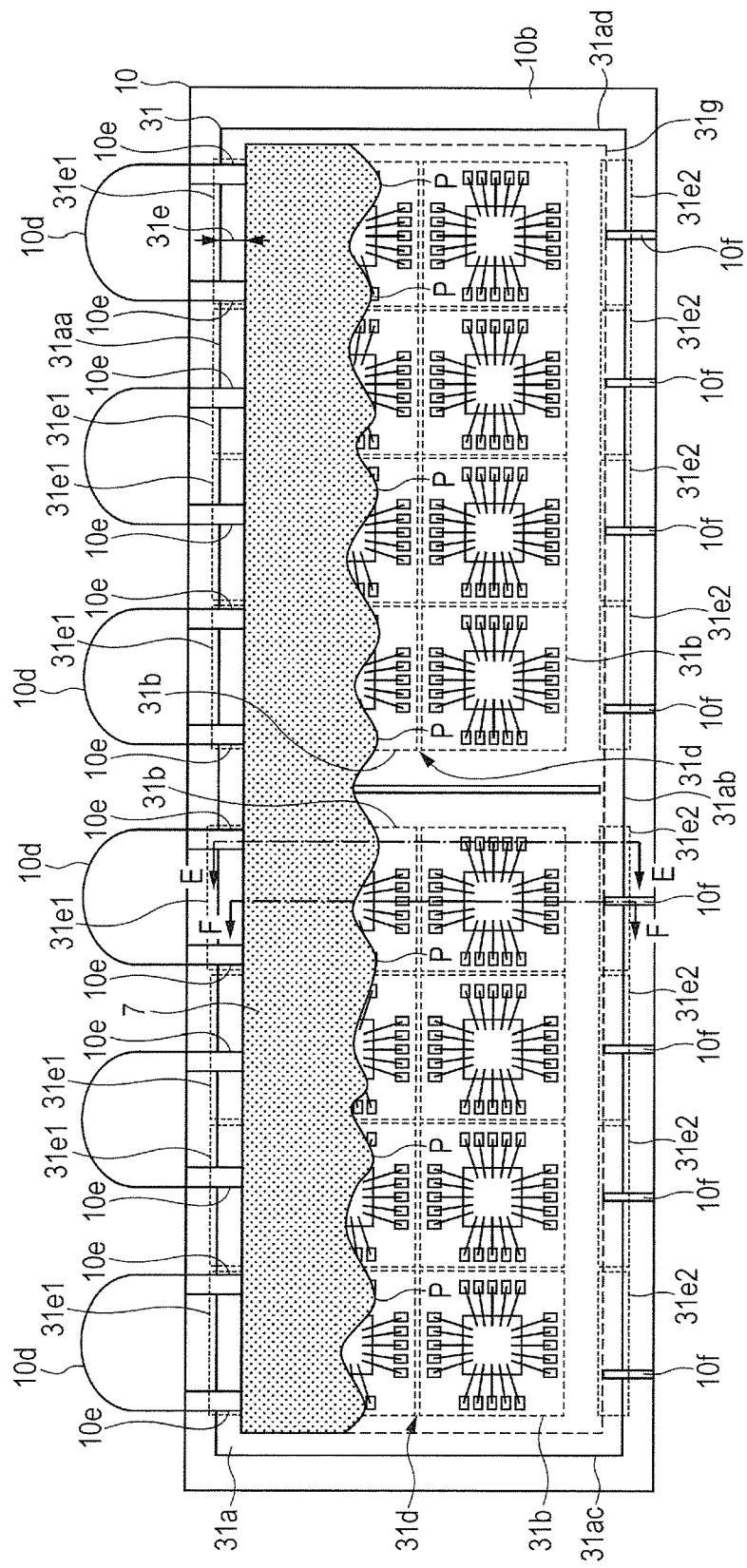
FIG. 15 is a plan view showing an example of the configuration in which the resin is injected during the molding step in assembling the semiconductor device of FIG. 1.
Figure 16:
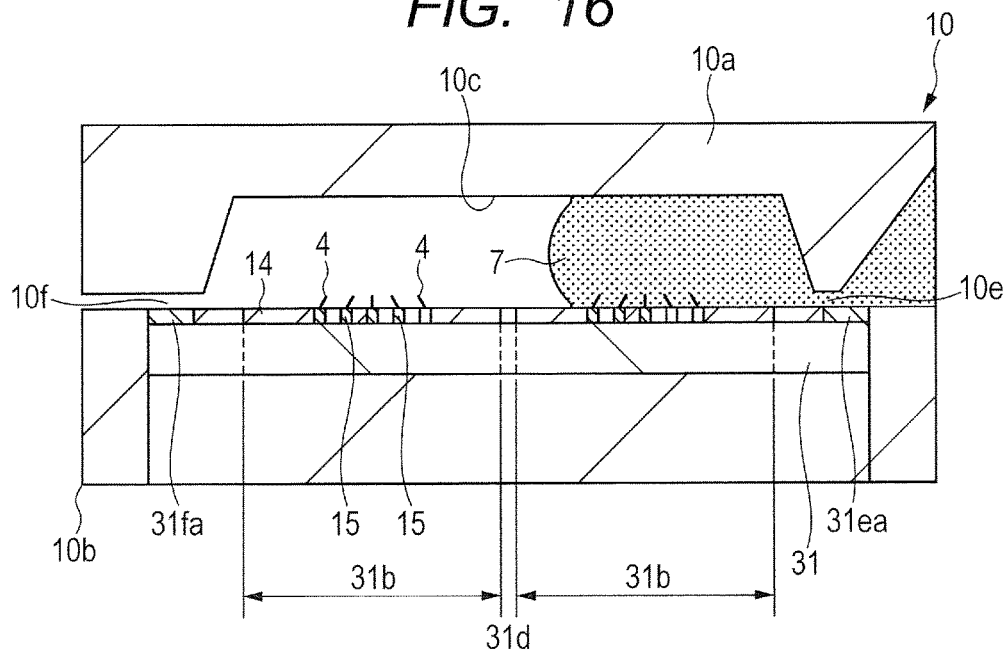
FIG. 16 is a sectional view showing an example of the configuration cut along line E-E line of FIG. 15.
Figure 17:
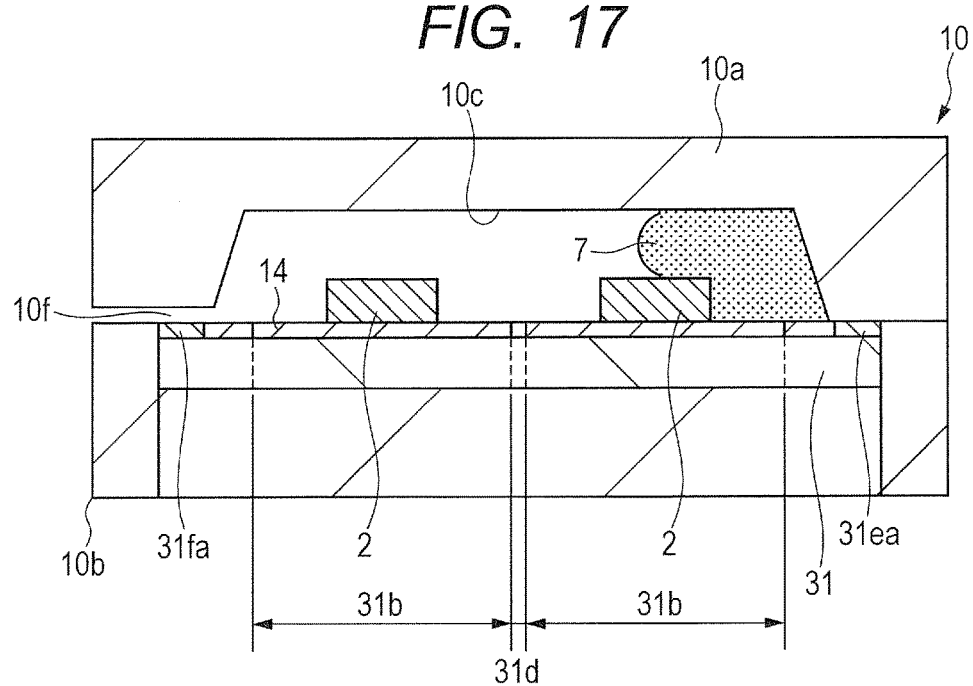
FIG. 17 is a sectional view showing an example of the configuration cut along line F-F of FIG. 15.
Figure 18:
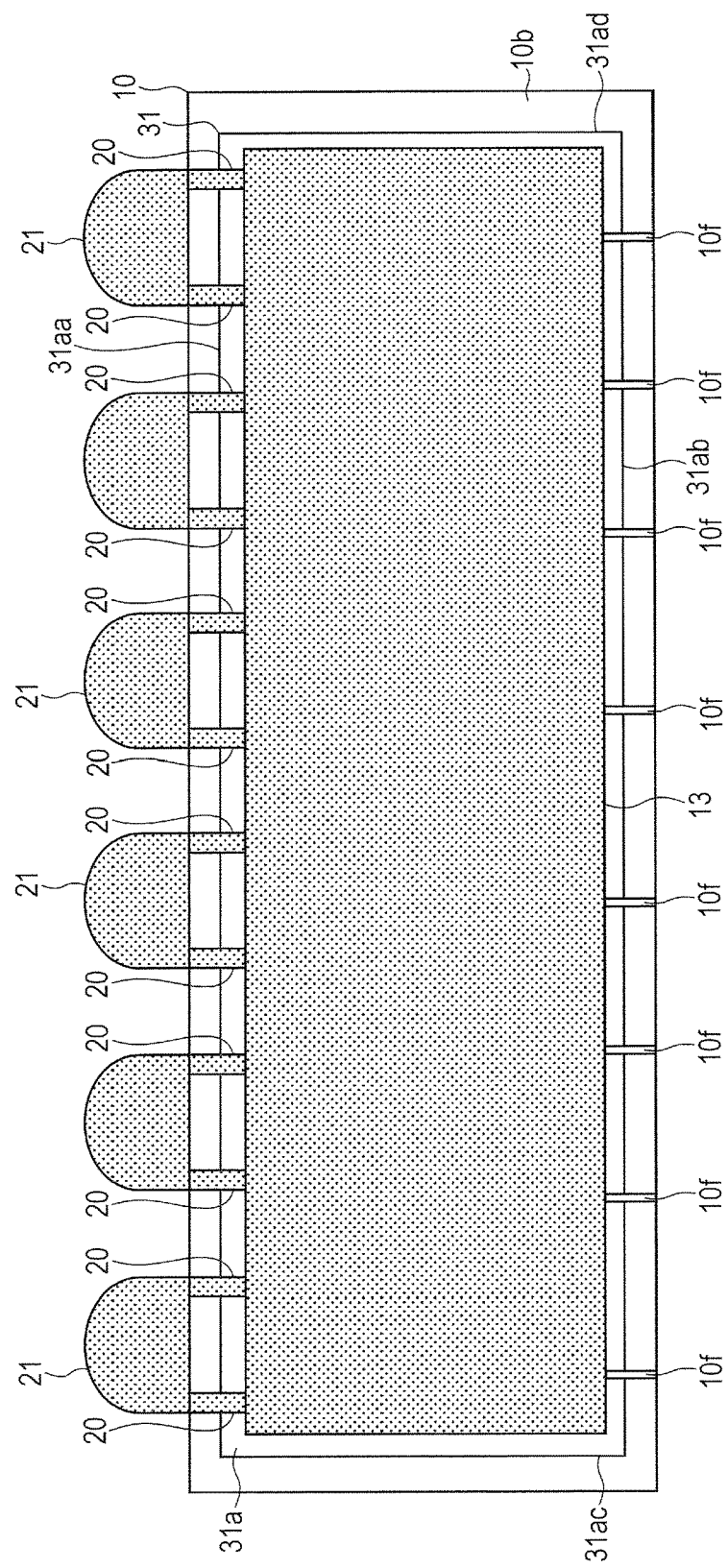
FIG. 18 is a plan view showing an example of the configuration after molding in the process of assembling the semiconductor device of FIG. 1.

FIG. 14 is a plan view showing an example of a state of the substrate being arranged in a molding die during a molding step in assembling the semiconductor device of FIG. 1. Moreover, FIG. 15 is a plan view showing an example of the configuration in which the resin is injected during the molding step in assembling the semiconductor device of FIG. 1; FIG. 16 is a sectional view showing an example of the configuration cut along line E-E of FIG. 15, FIG. 17 is a sectional view showing an example of the configuration cut along line F-F of FIG. 15, and FIG. 18 is a plan view showing an example of the configuration after molding in the process of assembling the semiconductor device of FIG. 1.

Sealing resin formation (step S4) shown in FIG. 11 is performed after the wire bonding. In the molding step, resin sealing by a transfer mold, for example, is performed, and a collective sealing body (sealing resin layer, sealing resin, sealing part, collective sealing part) 13 shown in FIG. 18 is so formed as to cover the semiconductor chips 2 and wires 4 over the wiring substrate 31.

In the molding step, first, as shown in FIG. 16, the dicing regions 31d and the semiconductor device regions 31b are covered by one cavity 10c of an upper mold 10a of a molding die 10. Then, as shown in FIG. 14, the wiring substrate (base material) 31 is arranged over a lower mold 10b of the molding die 10 of FIG. 16 such that a plurality of gates 10e is arranged in the edge region 31e.

That is, in the molding of Embodiment 1, as shown in FIG. 14, each of the gates 10e is arranged in a portion overlapping a molding regions 31g over the edge region 31e joining the semiconductor device region 31b. Further, each of the gates 10e is not arranged over the extended line of the dicing regions 31d. In this state, the resin 7 shown in FIG. 15 is injected.

Specifically, when performing a resin molding to the wiring substrate 31 where a groove 31db is formed in the dicing region 31d of the upper surface 31a, the gates 10e of the molding die 10 are arranged at positions, respectively, different from those over the extended line of the dicing region 31d of the wiring substrate 31 being in parallel to a straight line (see FIG. 4) L being orthogonal to the first side 31aa and the second side 31ab of the wiring substrate 31 and, in this state, the resin 7 is injected.

Further, in the example of Embodiment 1 shown in FIG. 14, two gates 10e are provided in each cull 10d. Further, as shown in FIGS. 16 and 17, a plurality of air vents 10f for discharging air are provided on the side (the second side 31ab of FIG. 14) opposed to the gate 10e of the cavity 10c of the molding die 10.

Thus, in a state where the wiring substrate 31 is arranged over the lower mold 10b of the molding die 10, as shown in FIGS. 15 and 16, the resin 7 is injected from each of the gates 10 into the cavity 10c. Further, the resin 7 is allowed to advance from the first side 31aa towards the second side 31ab of the wiring substrate 31 and to fill the cavity 10c with the resin 7. Thus, a collective sealing body (sealing resin layer) 13 shown in FIG. 18 is formed over the upper surface 31a of the wiring substrate 31.

A problem to be solved by the present application will be now explained in detail.

Over the base material such as the wiring substrate 31 etc. (including a lead frame 19 etc. shown in FIG. 21 to be described later), the semiconductor device regions (device regions) 31b and the dicing regions (cutting regions) 31d arranged among the device regions are formed. Further, as shown in FIG. 7, in the dicing regions 31d, feeders 31da are provided for forming electrolytic plating in each of the connecter terminals 15 being electrodes of the wiring substrate 31. Still further, each connection terminal 15 is electrically coupled with the feeder 31da formed in the dicing region 31d through the wiring part 17 etc.

Thus, when performing electrolytic plating, a plating process is applied by giving a voltage to each connection terminal 15 through the feeder 31da and the wiring part 17.

Then, an electric test is given to the base material after completion of the plating. In this regard, the electric test cannot be conducted if connection terminals 15 are electrically coupled with one another through the feeders 31da at this time. Therefore, it is necessary to remove the feeders 31da inside the dicing region 31d and to form a base material configuration where the connection terminals 15 are not electrically coupled with one another.

Accordingly, in the case where the base material is the wiring substrate 31, etching is performed inside the dicing region 31d and the feeder 31da formed inside the dicing region 31d is removed, achieving a configuration where the connection terminals 15 are not electrically coupled. Thus, it becomes possible to conduct the electric test of the wiring substrate 31.

By having performed the etching to remove the feeders 31da, as shown in FIG. 10, in the dicing region 31d, a groove 31db or a stepped portion extending along the dicing region 31d is formed.

Moreover, in the molding step, during resin injection, as shown in FIG. 14, when the wiring substrate 31 is arranged in the lower mold 10b of the molding die 10, as seen from the above (in a plan view), in the edge region 31e (see FIG. 4) on the side of the first side 31aa of the wiring substrate 31, the gates 10e from which the resin 7 is injected are arranged. Also, the air vents 10f (see FIG. 14) which discharge air are arranged in the edge region 31e of the second side 31ab of the wiring substrate 31. Further, as shown in FIG. 4, in the edge region 31e on the side of the first side 31aa of the wiring substrate 31, a plurality of gate patterns 31ea in which the gates 10e are arranged are formed. Still further, a plurality of air vent patterns 31fa in which the air vents 10f are arranged are formed in the edge region 31e of the second side 31ab of the wiring substrate 31.

In this regard, during resin injection, in a state where the gates 10e and the dicing regions 31d are arranged over a straight line vertically coupling the first side 31aa of the wiring substrate 31 with the second side 31ab of the wiring substrate 31 opposed to the first side 31aa, when the resin is injected, it entrains air from the groove 31db of the dicing region 31d, which causes an air trap.

In other words, in a state where the gate pattern arrangement regions 31e1 in which the gates 10e are arranged, respectively, and the dicing regions 31d extending from the first side 31aa to the second side 31ab are arranged over the straight line, respectively, when the resin is injected, the resin 7 flows into the groove 31db or the stepped portion of the dicing region 31d and entrains the air stagnating in the groove 31db or the stepped portion, which causes the air trap.

As a result, voids are formed over the dicing region 31d, which causes poor appearance of the semiconductor device (BGA1) after the dicing (cutting-into-pieces) or formation of a starting point of a crack which may occur during a reflow process. As a result, the reliability of the semiconductor device (BGA1) is deteriorated and the yield rate thereof is lowered.

In view of the above, according to Embodiment 1, as shown in FIG. 14, in a plan view, the gates 10e of the molding die 10 are arranged at positions different from those over the extended lines of the dicing regions 31d of the wiring substrate 31, and the resin 7 is injected from the gates 10e. In this way, the entrainment of the air in the dicing regions 31d can be reduced and an occurrence rate of the void can be lowered. That is, in a plan view, the gates 10e are arranged in the gate pattern arrangement regions 31e1 (regions corresponding to the semiconductor device regions 31b, respectively) joining the semiconductor device regions 31b, and the resin 7 is injected.

When the resin 7 is injected from the gates 10e, as shown in FIGS. 15 to 17, the resin 7 advances from the first side 31aa toward the second side 31ab of the wiring substrate 31. At that time, as shown in FIG. 15, in a plan view, of the resin 7 supplied into the cavity 10c, a vertex P at the tip thereof advancing fastest toward the second side 31ab is located in the semiconductor device region 31b.

That is, when the gates 10e are arranged, respectively, over the extended lines of the dicing regions 31d of the wiring substrate 31, the vertex P of the flowing resin 7 is located over the dicing regions 31d, making it easier to entrain the air stagnating in the grooves 31db of the dicing regions 31d. However, as in Embodiment 1, when the gates 10e are arranged, respectively, at the positions different from those over the extended lines of the dicing regions 31d of the wiring substrate 31, the passage of the resin 7 becomes different from that of the case where the gates 10e are arranged, respectively, over the extended line of the dicing regions 31d. That is, the vertex P of the resin 7 flowing toward the second side 31ab is located in the semiconductor device region 31b.

As a consequence, in the dicing regions 31d, the air become less likely to be entrained. That is, it is preferable that there should be least possible obstacles such as the dicing regions 31d etc. in the passage of the resin 7. Therefore, as described above, by arranging the gates 10e such that the vertex P of the flowing resin 7 is located in the semiconductor device region 31b, it becomes possible to reduce the entrainment of the air.

Also, in the molding die 10 of Embodiment 1, for installation of the gates 10e at respective positions, a changeable piece system is adopted. Alternatively, there is adopted a gate-switchable molding dies capable of changing setup locations of the gates 10e.

Further, when a depth T of the groove 31db formed in each of the dicing regions 31d of the wiring substrate 31 shown in FIG. 10 is greater than a width S (T>S), the resin 7 is more likely to entrain the air in the groove 31db. However, as shown in Embodiment 1, by arranging the gates 10e at positions, respectively, different from those over the extended lines of the dicing regions of the wiring substrate 31, it becomes possible to reduce entrainment of voids even when the depth of the groove 31db is greater than its width.

As described above, the resin 7 is injected thorough the gates 10e, and a collective sealing body (sealing resin layer) 13 as shown in FIG. 18 is formed over the wiring substrate 31. Also, over the wiring substrate 31, a gate resin 20 and a cull resin 21 are formed together with the collective sealing body 13. The resin 7 which forms the collective sealing body 13 is, for example, a thermosetting resin material etc. However, the collective sealing body 13 is formed using an epoxy resin or the like containing a filler.

5. Solder Ball Coupling Step

After completion of the molding, solder ball coupling (external terminal formation, step S5) shown in FIG. 11 is performed. In the solder ball coupling step, for example, a lower surface 32a of the wiring substrate 31 is turned up and, over the lands 16 of the lower surface 32a of the wiring substrate 31, solder balls 6 are arranged (mounted), respectively, and temporarily fixed by a flux etc.

Then, a reflow process (solder reflow process, thermal processing) is performed to melt the solder and to couple the solder balls 6 with the lands 16 of the wiring substrate 31. Thus, the solder balls 6 as external terminals (external connection terminals) of the semiconductor device are coupled (formed).

6. Dicing Step

FIG. 19 is a fragmentary enlarged plan view showing an example of the configuration at the time of the dicing in an assembly of the semiconductor device of FIG. 1.

The dicing (step S6) shown in FIG. 11 is performed after coupling the solder balls. In the dicing step, as shown in FIG. 19, with use of a dicing blade (dicing saw, blade) 9 etc., dicing (separation, cutting) is performed from the side of the lower surface (second surface, back surface, mounting surface, ball mounting surface) 32a of the wiring substrate 31 along the dicing region (dicing line, boundary part of each semiconductor device region) between the semiconductor device regions 31b. Thus, the collective sealing body 13 and the wiring substrate 31 are separated (divided).

That is, the collective sealing body 13 and the wiring substrate 31 are cut along the dicing region 31d, and the semiconductor device region is cut and divided (cut into pieces) into individual (cut-into-pieces) semiconductor devices (BGA1). That is, the collective sealing body 13 and the wiring substrate 31 are cut and divided into semiconductor device regions, and the BGA1 is formed from each semiconductor device region.

As described above, by separation and cutting into pieces, the BGA1 as shown in FIGS. 1 to 3 can be manufactured.

<Effects>

According to the method for manufacturing the semiconductor device of Embodiment 1, in a plan view, the gates 10e of the molding die 10 are arranged at the positions different from those over the extended lines of the respective dicing regions 31d of the wiring substrate 31 and the resin 7 is injected from the gates 10e. In this way, it becomes possible to reduce the entrainment of the air in the dicing regions 31d and to lower the occurrence rate of the voids.

As a consequence, it becomes possible to suppress an occurrence of poor appearance such as formation of voids in the sealing body 5 and to suppress formation of a starting point of a crack which may occur during a reflow process. Thus, the reliability of the BGA1 can be improved. Also, the yield rate of the BGA1 can be enhanced.

Embodiment 2

In Embodiment 2, there will be explained an advancing position of the vertex P of the flow of the resin 7 during the resin injection into the molding die 10 in the molding step.

In a plan view shown in FIGS. 14 and 15, the gates 10e are arranged, respectively, over the extended lines along a direction in which the semiconductor device regions 31b of the wiring substrate 31 continuously join the gate pattern arrangement regions 31e1. Then, the resin 7 is supplied into a cavity 10c from the gates 10e. Accordingly, in a plan view, the vertex P at the tip of the resin 7 advancing toward the second side 31ab shown in FIG. 15 passes through a region between the semiconductor chip 2 and the dicing regions 31d.

When seeing the above as a passage of the resin 7, in a plan view, the region between the semiconductor chip 2 and the dicing regions 31d has least obstacles. That is, by allowing the vertex P of the resin 7 to advance in the region having the least obstacles, while suppressing the entrainment of the air, it becomes possible to make the resin 7 evenly spread all over the semiconductor device region 31b. As a result, formation of voids in the sealing body 5 can be reduced.

Further, FIG. 16 shows an example of how the resin flows in a region beside the semiconductor chip 2 (a region where there exists no semiconductor chip 2 and, at the same time, a region between the semiconductor chip 2 and the dicing regions 31d). On the other hand, FIG. 17 shows an example of how the resin 7 flows over the semiconductor chip 2.

In other words, since the semiconductor chip 2 has its thickness, part of the resin 7 injected into the molding die 10 is made to flow right and left of the semiconductor chip 2. Thus, there occurs a difference in advancing speed of the resin 7 between in a region above the semiconductor chip 2 and in a region beside the semiconductor chip 2. More specifically, in one semiconductor device region 31b, the speed of the resin 7 flowing above the semiconductor chip 2 is lower than that of the resin 7 flowing beside the semiconductor chip 2.

Therefore, the gates 10e are arranged, respectively, at positions where there are least possible obstacles for the passage of the resin, i.e., the positions corresponding to the region between the semiconductor chip 2 and the dicing regions 31d. In this way, in a plan view, the advancing vertex P at the tip of the resin 7 is allowed to pass through the region between the semiconductor chip 2 and the dicing regions 31d, thereby suppressing the involvement of the void.

As a result, the reliability of the BGA1 can be improved. Also, the yield rate of the BGA1 can be enhanced.

Embodiment 3

In Embodiment 3, a relationship in size between the semiconductor device region 31b of the wiring substrate 31 and a circumferential part thereof will be explained.

In the wiring substrate 31 shown in FIG. 4, it is such that a length L3 of one side of the semiconductor device region 31b is shorter than the sum of a gap L1 between the gate patterns 31ea arranged along the first side 31aa of the wiring substrate 31 and the semiconductor device region 31b and a gap L2 between the air vent patterns 31fa arranged along the second side 31ab of the wiring substrate 31 and the semiconductor device region 31b. That is, the relationship thereof is: L1+L2>L3

The above relationship, L1+L2>L3, will be now explained. From a single wiring substrate 31, as many semiconductor devices as possible should be obtained. Therefore, L1 and L2 should be as small as possible (An area where the semiconductor device is formed should be as large as possible). However, when L1 and L2 are made smaller, on the L1 side, a distance between the gates 10e and the semiconductor device region 31b becomes shorter, causing a resin pressure during the resin injection to be higher. In such a case, involvement of voids on the L1 side increases.

Therefore, L1 should be made large to such an extent as not to increase the involvement of the voids.

On the other hand, when L2 becomes shorter, the passage of the air vent 10f cannot be secured. Therefore, L2 also should be long enough to secure the passage of the air vent 10f.

That is, allowing a distance between the semiconductor device region 31b and the gates 10e as well as a distance between the semiconductor device region 31b and the air vent 10f to be greater, respectively, (L1+L2>L3) means to make L1 and L2 greater even by sacrificing the increase in the semiconductor device region 31b. Therefore, by achieving L1+L2>L3, while suppressing the injection pressure of the resin 7 on the side of the gates 10e (the first side 31aa), it becomes possible to discharge air as much as possible on the air vent 10f side (the second side 31ab).

In other words, by allowing the above relationship L1+L2>L3, it becomes possible to reduce pressure in a flow cavity (it becomes possible to discharge as much as air as possible from the cavity 10c and to suppress formation of the void).

Moreover, as shown in FIG. 14, the gates 10e (two gates, in Embodiments 1 to 3) are provided in a single semiconductor device region 31b. For example, in the edge region 31e corresponding to one semiconductor device region 31b, gates 10e are arranged on both sides of the semiconductor chip 2.

Consequently, in a flow of the resin 7, the number of passages increases. As a result, the flow of the resin 7 can be made uniform and, eventually, formation of the voids can be suppressed. Thus, the reliability of the semiconductor device can be improved. Also, the yield rate of the semiconductor device can be enhanced.

The invention made by the present inventors has been so far concretely explained in reference to the preferred embodiments thereof. However, the invention is not limited thereto and it is obvious that these details are modified in various ways without departing from the spirit and scope thereof.

(Modification 1)

Figure 20:
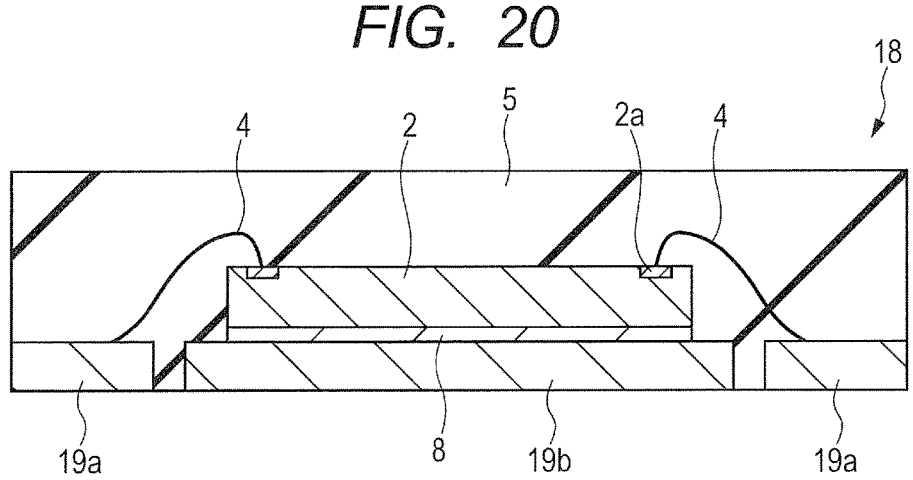
FIG. 20 is a sectional view showing the configuration of a semiconductor device according to Modification 1.
Figure 21:
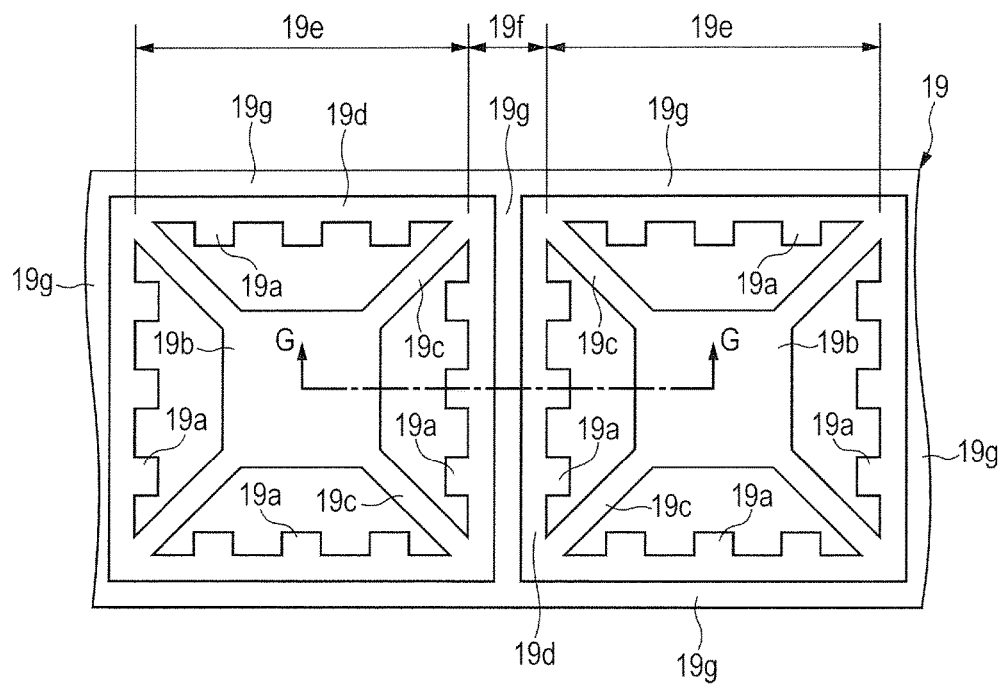
FIG. 21 is a fragmentary enlarged plan view showing the configuration of a base material used in assembling the semiconductor device shown in FIG. 20.
Figure 22:
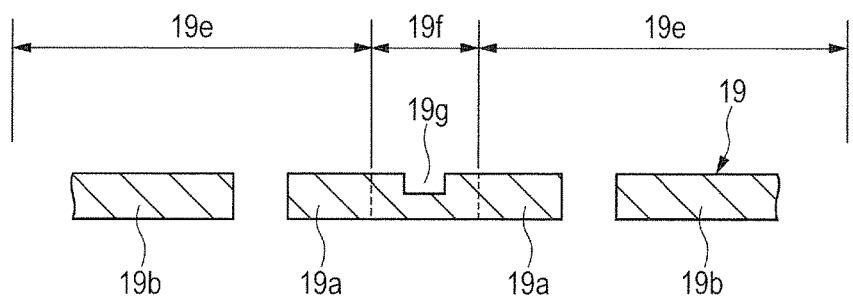
FIG. 22 is a fragmentary sectional view showing an example of the configuration cut along line G-G of FIG. 21.

FIG. 20 is a sectional view showing the configuration of a semiconductor device according to Modification 1, FIG. 21 is a fragmentary enlarged plan view showing the configuration of a base material used in assembling the semiconductor device shown in FIG. 20, and FIG. 22 is a fragmentary sectional view showing an example of the configuration cut along line G-G of FIG. 21.

The semiconductor device of Modification 1 is a QFN (Quad Flat Non-leaded Package) 18 which is assembled with use of a lead frame 19. In Modification 1, there is explained a case of a MAP-QFN where semiconductor device regions (second regions, device regions) 19e included in the lead frame 19 are molded with resin collectively. Accordingly, the lead frame 19 is a matrix frame which includes the semiconductor device regions 19e.

Now, a configuration of a QFN 18 shown in FIG. 20 will be explained. First, the semiconductor chip 2 is mounted through the adhesive 8 over the die pad 19b. Further, each of the electrodes 2a included in the semiconductor chip 2 is electrically coupled through the wire 4 with each of the (a plurality of) lead parts 19a which are provided around the die pad 19b. Still further, the resin seal of the semiconductor chip 2 and the wires 4 is carried out with the sealing body (sealing resin layer) 5.

On the back surface side of the sealing body 5, part of each of the leads 19a is exposed. The part of each of the leads 19a exposed over the back surface of the sealing body 5 serves as an external terminal of the QFN 18. Furthermore, part of the die pad 19b is also exposed over the back surface of the sealing body 5. In addition, the die pad 19b is supported at corners, for example, by four hanger leads 19c.

FIG. 21 shows part of a configuration of the lead frame 19 used when assembling the QFN 18, and shows two adjacent semiconductor device regions 19e. In a frame part 19d surrounding each semiconductor device region 19e, a dicing region (the first region) 19f which is a cutting region is formed, and a groove (or a stepped portion) 19g as shown in FIG. 22 is formed in each of the dicing regions 19f.

In the dicing region 19f, the above groove 19g is formed, as shown in FIG. 21, along the dicing region 19f. Further, by reducing the thickness of the cut portion in the cutting region of the lead frame 19, the groove 19g enables a reduction in load given to a dicing blade at the time of dicing (cutting-into-pieces) and cutting easy. However, because of the groove 19g being formed, when the resin is injected during the molding step, it is likely to entrain the air stagnating in the groove 19g, resulting in an occurrence of voids.

Consequently, according to Modification 1, as in Embodiments 1 to 3, in a plan view, during resin injection in the molding step, the gates 10e of the molding die 10 are arranged at positions different from those over the extended lines of the respective dicing regions 19f of the lead frame 19. In this state, by injecting the resin 7 from the gates 10e, the entrainment of the air in the dicing region 19f can be reduced and the occurrence rate of the voids can be lowered.

Thus, it becomes possible to suppress an occurrence of poor appearance such as formation of voids in the sealing body 5 and to suppress formation of a starting point of a crack which may occur during a reflow process. As a result, the reliability of the QFN 18 can be improved. Also, the yield rate of the QFN 18 can be enhanced.

Also, since other means and effects of Modification 1 are similar to those of Embodiments 1 tot, the overlapping explanations thereof are omitted.

(Modification 2)

Although Embodiments 1 to 3 are concerned with the BGA1 as an example of a semiconductor device, the semiconductor device is not limited to the BGA1, and it is an LGA (Land Grid Array) type semiconductor device where conductive members are formed over a surface of the land 16.

(Modification 3)

Furthermore, the details of Embodiments described above are applicable in various ways by combining Modifications without departing from the spirit and scope thereof.

What is claimed is:

1. A method for manufacturing a semiconductor device, comprising the steps of:
   (a) preparing a base material having a main surface, a first side included in the main surface, a second side opposed to the first side included in the main surface, a plurality of first regions extending from the first side toward the second side over the main surface, a plurality of second regions formed between the respective first regions over the main surface, and a plurality of third regions formed between the first side and the second regions;
   (b) after step (a), mounting a semiconductor chip in each of the plurality of second regions of the base material;
   (c) after step (b), covering the first regions and the second regions with one cavity of a molding die and arranging the base material in the molding die such that a plurality of gates is arranged in the third regions; and (d) after step (c), injecting resin into the cavity from the plurality of gates and forming a sealing resin layer over the main surface of the base material, wherein each of the plurality of first regions have groove formed along the first regions, respectively, wherein, in a plan view, over a straight line vertically crossing the first side and the second side, one of the second regions and one of the third regions are arranged in a continuously joined manner, and wherein, during the step (d), the resin is injected from the first side toward the second side and, in a plan view, the resin is injected such that the vertex of the tip which advances toward the second side most rapidly of the resin supplied into the cavity is located in the second region.

2. The method for manufacturing a semiconductor device according to claim 1, wherein, in the step (d), in a plan view, the resin is supplied into the cavity from the plurality of gates arranged over an extended line along a direction in which the second region continuously joins the third region and, the vertex of the tip which advances toward the second side of the resin passes through a region between the semiconductor chip and the first region.

3. The method for manufacturing a semiconductor device according to claim 1, wherein a side of the second regions is shorter than the sum of a gap between a plurality of gate patterns arranged along the first side of the base material and the second regions and a gap between an air vent pattern arranged along the second side of the base material and the second region.

4. The method for manufacturing a semiconductor device according to claim 1, wherein the plurality of gates are arranged in one of the second regions.

5. The method for manufacturing s semiconductor device according to claim 1, wherein the base material is a wiring substrate having a first surface over which the semiconductor chip is mounted and a second surface opposite to the first surface, and wherein a wiring part and an insulating film which is covering the wiring part are formed over the first surface.

6. The method for manufacturing a semiconductor device according to claim 5, wherein the groove in the first region is a concave stepped portion having a wall part including the wiring part and the insulating film.

* * * * *